US012598850B2

(12) United States Patent
Jung et al.

(10) Patent No.: US 12,598,850 B2
(45) Date of Patent: Apr. 7, 2026

(54) DISPLAY MODULE AND AN ELECTRONIC DEVICE INCLUDING THE SAME

(71) Applicant: Samsung Display Co., Ltd., Yongin-Si (KR)

(72) Inventors: Yeon-Shil Jung, Yongin-si (KR);
Dong-Ho Kim, Yongin-si (KR);
Junhyun Lee, Yongin-si (KR);
Hwanwoo Lee, Yongin-si (KR);
Haegoo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 418 days.

(21) Appl. No.: 18/454,189

(22) Filed: Aug. 23, 2023

(65) Prior Publication Data

US 2024/0204155 A1    Jun. 20, 2024

(30) Foreign Application Priority Data

Dec. 15, 2022    (KR) ........................ 10-2022-0175833

(51) Int. Cl.
| | |
|---|---|
| *H10H 20/857* | (2025.01) |
| *G06F 3/044* | (2006.01) |
| *G09G 3/32* | (2016.01) |
| *H01L 25/075* | (2006.01) |
| *H01L 25/16* | (2023.01) |

(52) U.S. Cl.
CPC ......... *H10H 20/857* (2025.01); *G06F 3/0446* (2019.05); *G09G 3/32* (2013.01); *H01L*

*25/0753* (2013.01); *H01L 25/167* (2013.01); *G09G 2310/0275* (2013.01)

(58) Field of Classification Search
CPC ........ G09G 3/32; H01L 25/167; H10D 86/60; H10K 59/1213; H10K 59/123; H10K 59/124; H10K 59/40
See application file for complete search history.

(56) References Cited

U.S. PATENT DOCUMENTS

| | | | |
|---|---|---|---|
| 9,053,664 B2 | 6/2015 | Lee | |
| 2013/0120329 A1* | 5/2013 | Wang .................. | G02F 1/13452 |
| | | | 345/206 |
| 2018/0063954 A1 | 3/2018 | Kim et al. | |

(Continued)

FOREIGN PATENT DOCUMENTS

| | | |
|---|---|---|
| JP | 2021-180007 | 11/2021 |
| KR | 10-1850994 | 4/2018 |

(Continued)

*Primary Examiner* — Mamadou L Diallo
(74) *Attorney, Agent, or Firm* — F. CHAU & ASSOCIATES, LLC

(57) ABSTRACT

A display module including: a display panel including pixels arranged in a display area, first signal pads arranged in a non-display area and electrically connected to the pixels through signal lines, and second signal pads arranged in the non-display area and spaced farther from the display area than the first signal pads; first insulating patterns arranged at edges of the first signal pads; second insulating patterns arranged at edges of the second signal pads; and an insulating film disposed on the non-display area, wherein the insulating film is spaced apart from the first signal pads and the first insulating patterns, overlaps the edges of the second signal pads, and covers the second insulating patterns.

20 Claims, 14 Drawing Sheets

(56)     References Cited

U.S. PATENT DOCUMENTS

| | | | |
|---|---|---|---|
| 2020/0159356 A1 | 5/2020 | Tada et al. | |
| 2020/0174623 A1* | 6/2020 | Lee | H10K 59/65 |
| 2020/0286965 A1* | 9/2020 | Lim | H10K 71/00 |
| 2020/0350390 A1* | 11/2020 | Kim | H10K 59/124 |
| 2020/0411626 A1 | 12/2020 | Yasuda et al. | |
| 2021/0055760 A1* | 2/2021 | Lee | G09G 3/035 |
| 2021/0288015 A1* | 9/2021 | Jang | H05K 1/189 |
| 2021/0303094 A1* | 9/2021 | Kwak | G06F 3/0443 |
| 2021/0335986 A1 | 10/2021 | Jeon et al. | |
| 2022/0013614 A1 | 1/2022 | Jung et al. | |
| 2022/0022318 A1* | 1/2022 | Kim | H05K 1/118 |
| 2022/0216177 A1* | 7/2022 | Jo | H01L 24/32 |
| 2022/0317489 A1* | 10/2022 | Lee | G02F 1/1345 |
| 2022/0384555 A1 | 12/2022 | Ma et al. | |
| 2023/0071460 A1* | 3/2023 | Ko | H10K 59/82 |
| 2025/0006879 A1* | 1/2025 | Choi | H10H 20/857 |
| 2025/0216964 A1* | 7/2025 | Ahn | G06F 3/04164 |

FOREIGN PATENT DOCUMENTS

| | | |
|---|---|---|
| KR | 10-2020-0076949 | 6/2020 |
| KR | 10-2021-0131508 | 11/2021 |
| WO | 2019167239 A1 | 9/2019 |

* cited by examiner

TEX: TEX1~TEX6
TEY: TEY1~TEY4

FIG. 8A

DISPLAY MODULE AND AN ELECTRONIC DEVICE INCLUDING THE SAME

CROSS-REFERENCE TO RELATED APPLICATION

This application claims priority under 35 U.S.C. § 119 to Korean Patent Application No. 10-2022-0175833 filed on Dec. 15, 2022, in the Korean Intellectual Property Office, the disclosure of which is incorporated by reference herein in its entirety.

TECHNICAL FIELD

The present disclosure relates to an electronic device including a display module for displaying an image and a display module bonded to a data driver.

DISCUSSION OF RELATED ART

Multimedia electronic devices, such as televisions, mobile phones, tablet personal computers (PCs), navigation devices, and game consoles often incorporate display modules responsible for image display and external input detection. These display modules may be electrically bonded to a data driver that supplies the necessary electrical signal for image display. However, during the bonding process, there is a risk of damaging an insulating film or pad of the display module. Consequently, further research is required to develop display modules that can prevent such damage.

SUMMARY

Embodiments of the present disclosure provide a display module with enhanced reliability by preventing damage to signal pads and an insulating film during the bonding process with a data driver. Furthermore, embodiments of the present disclosure provide an electronic device including the display module.

According to an embodiment of the present disclosure, there is provided a display module including: a display panel including pixels arranged in a display area, first signal pads arranged in a non-display area and electrically connected to the pixels through signal lines, and second signal pads arranged in the non-display area and spaced farther from the display area than the first signal pads; first insulating patterns arranged at edges of the first signal pads; second insulating patterns arranged at edges of the second signal pads; and an insulating film disposed on the non-display area, wherein the insulating film is spaced apart from the first signal pads and the first insulating patterns, overlaps the edges of the second signal pads, and covers the second insulating patterns.

The insulating film includes an inorganic material.

Each of the first insulating patterns and the second insulating patterns includes an organic material.

The insulating film includes a first opening, and the first signal pads and the first insulating patterns are disposed in the first opening.

The insulating film includes a plurality of first openings, and the plurality of first openings respectively overlap the first signal pads.

The insulating film includes a plurality of second openings, and the plurality of second openings overlap the second signal pads, respectively and do not overlap the second insulating patterns.

Each of the pixels includes a transistor and a light emitting element electrically connected to the transistor.

The first insulating patterns and the second insulating patterns include the same material as that of any one of insulating layers arranged between the transistor and the light emitting element.

The first signal pads and the second signal pads include conductive patterns stacked in a thickness direction of the display panel.

The transistor includes a semiconductor pattern and a gate electrode disposed on the semiconductor pattern, and at least one of the conductive patterns of the first signal pads and the second signal pads includes the same material as that of the gate electrode.

The display panel further includes a connection electrode connecting the transistor and the light emitting element, and at least one of the conductive patterns of the first signal pads and the second signal pads includes the same material as that of the connection electrode.

The display module further includes an input detection unit disposed on the display panel and including an insulating layer and a detection conductive layer, wherein at least one of the conductive patterns of the first signal pads and the second signal pads includes the same material as that of the detection conductive layer.

The input detection unit includes: a base layer in contact with the display panel; a first detection conductive layer disposed on the base layer; a detection insulating layer disposed on the first detection conductive layer; and a second detection conductive layer disposed on the detection insulating layer, and the insulating film includes the same material as that of the base layer or the detection insulating layer.

At least one of the conductive patterns of the first signal pads includes a first conductive layer, a second conductive layer, and a third conductive layer, and the second conductive layer includes a material different from that of the first conductive layer and the third conductive layer.

The first insulating patterns cover edges of the first conductive layer, the second conductive layer, and the third conductive layer of the first signal pads.

The first signal pads include a plurality of pad rows formed by the first signal pads arranged in a first direction among the first signal pads, and the plurality of pad rows are arranged in a second direction intersecting the first direction.

According to an embodiment of the present disclosure, there is provided an electronic device including: a display panel including pixels arranged in a display area and first and second signal pads arranged in a non-display area; an input detection unit disposed on the display panel; an electronic module disposed below the display area; and a data driver disposed on the non-display area and including input bumps electrically connected to the first signal pads and output bumps electrically connected to the second signal pads, wherein the input detection unit includes an insulating film extending from the display area to the non-display area, and the insulating film does not overlap the first signal pads and overlaps edges of the second signal pads.

The electronic device may further include: a conductive adhesive disposed between the data driver and the display panel, wherein the conductive adhesive includes an adhesive resin and conductive particles in the adhesive resin.

The electronic device may further include: first insulating patterns arranged at edges of the first signal pads; and second insulating patterns arranged at the edges of the second signal pads, wherein the insulating film is spaced apart from the first insulating patterns and covers the second insulating patterns.

Each of the first signal pads and the second signal pads includes a first conductive layer, a second conductive layer, and a third conductive layer arranged in a thickness direction of the display panel, the second conductive layer includes a material different from those of the first conductive layer and the third conducive layer, the first insulating patterns cover edges of the first conductive layer, the second conductive layer, and the third conductive layer of the first signal pads, and the second insulating patterns cover edges of the first conductive layer, the second conductive layer, and the third conductive layer of the second signal pads.

BRIEF DESCRIPTION OF THE DRAWINGS

The above and other features of the present disclosure will become apparent by describing in detail embodiments thereof with reference to the accompanying drawings.

FIG. 8A is a cross-sectional view of the display module according to an embodiment of the present disclosure.

DETAILED DESCRIPTION OF THE EMBODIMENTS

Figure 1:
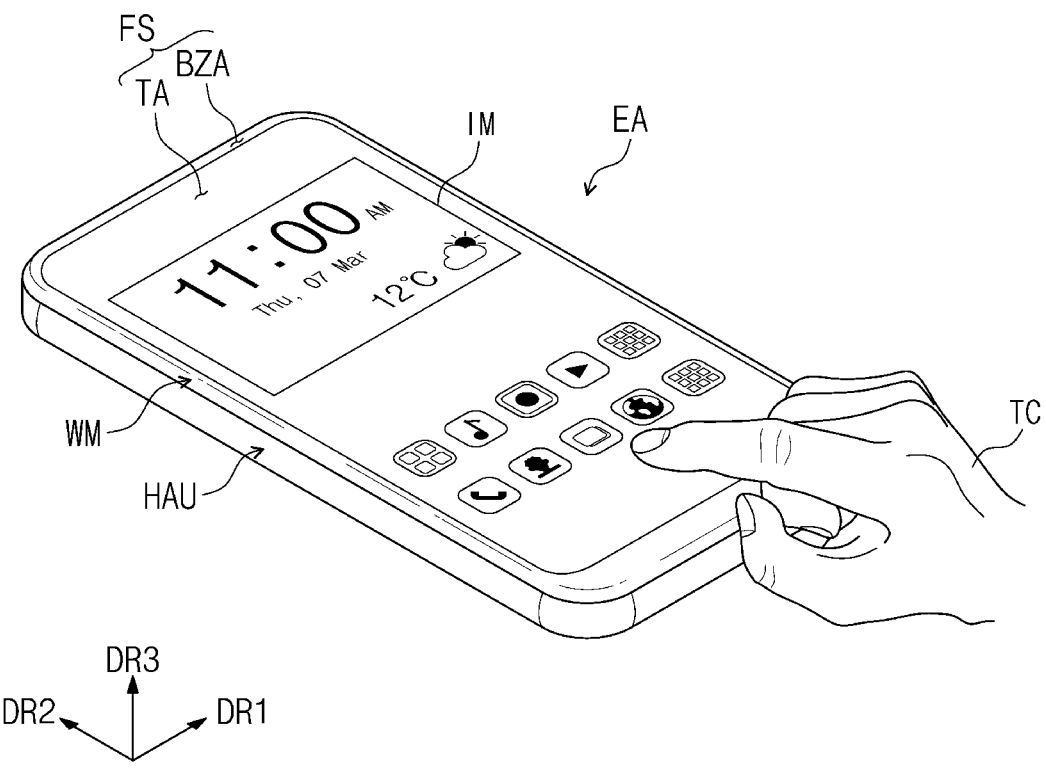
FIG. 1 is a perspective view of an electronic device according to an embodiment of the present disclosure.

Embodiments of the present disclosure will herein be described in detail with reference to the accompanying drawings. However, it should be understood that the present disclosure is not limited to the embodiments set forth herein and includes various changes and substitutions that may be made by one of ordinary skill in the art.

In the present specification, the expression that a first component (or an area, a layer, a part, a portion, etc.) is "disposed on", "connected with" or "coupled to" a second component may mean that the first component is directly disposed on/connected with/coupled to the second component or mean that a third component is interposed therebetween.

The same reference numerals may refer to the same components throughout the specification. Further, in the drawings, the thickness, the ratio, and the dimension of components may be exaggerated for effective description of the technical contents. The term "and/or" includes all combinations of one or more components that may be defined by associated components.

Although the terms "first", "second", etc. may be used to describe various components, the components should not be limited by the terms. These terms are used to distinguish one component from another component. For example, a first component may be referred to as a second component, and similarly, the second component may be also referred to as the first component. Singular expressions include plural expressions unless clearly otherwise indicated in the context.

Additionally, the terms "under", "below", "on", "above", etc. are used to describe the correlation of components illustrated in the drawings. The terms that are relative in concept are described based on a direction illustrated in the drawings.

It will be understood that the terms "include", "comprise", "have", etc. specify the presence of features, numbers, steps, operations, elements, or components, described in the specification, or a combination thereof, and do not exclude the presence or additional possibility of one or more other features, numbers, steps, operations, elements, or components or a combination thereof.

Unless otherwise defined, all terms (including technical terms and scientific terms) used in the present specification have the same meaning as commonly understood by those skilled in the art to which the present disclosure belongs. Furthermore, terms such as terms defined in dictionaries commonly used should be interpreted as having a meaning consistent with their meaning in the context of the related technology, and should not be interpreted in an overly ideal or overly formal sense unless explicitly defined herein.

Hereinafter, a display module and an electronic device according to an embodiment of the present disclosure will be described with reference to the accompanying drawings.

Figure 2:
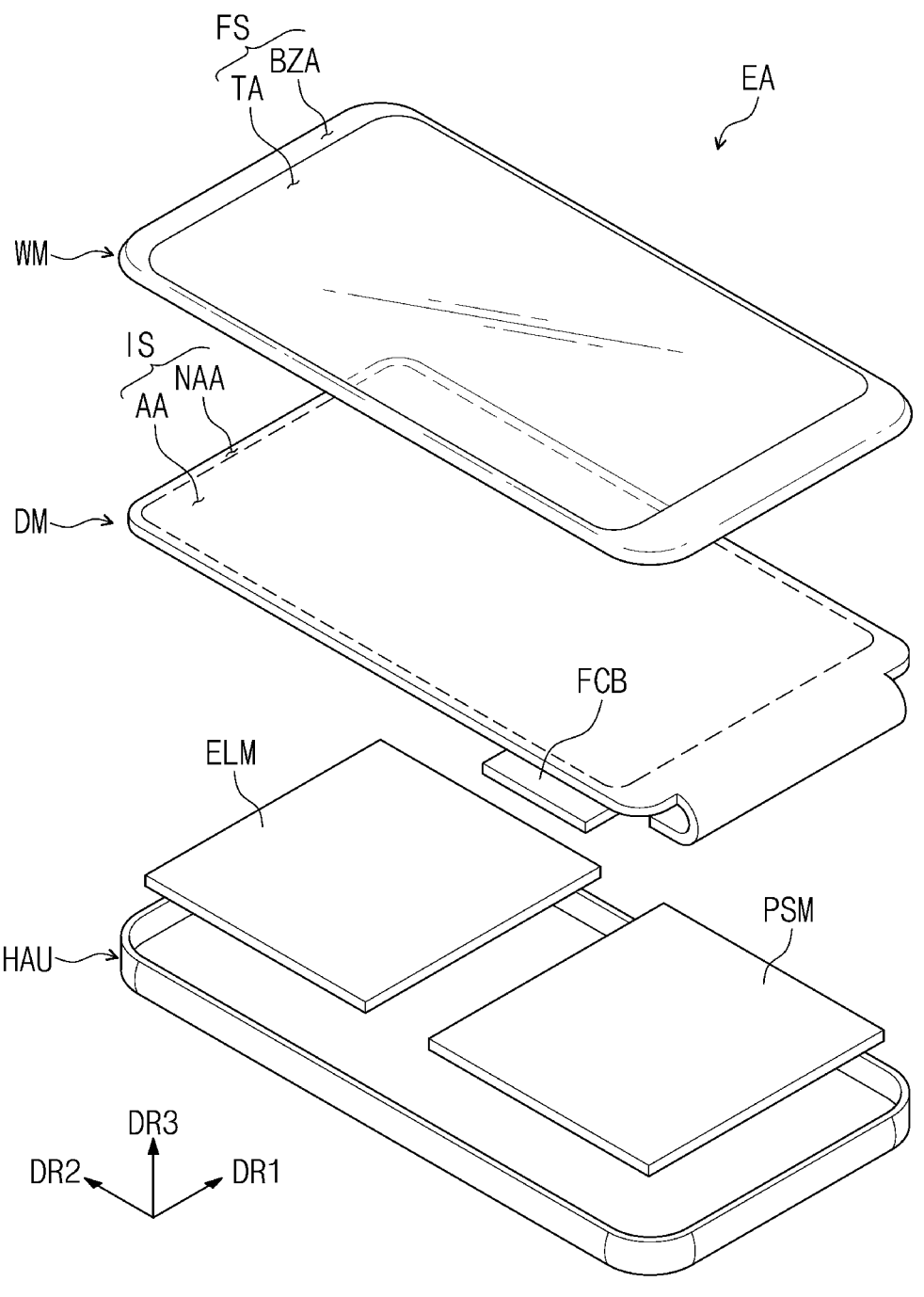
FIG. 2 is an exploded perspective view of the electronic device according to an embodiment of the present disclosure.

FIG. 1 is a perspective view of an electronic device EA according to an embodiment of the present disclosure. FIG. 2 is an exploded perspective view of the electronic device EA according to an embodiment of the present disclosure.

Referring to FIGS. 1 and 2, the electronic device EA may be a device that is activated according to an electrical signal, displays an image IM, and detects an external input TC. For example, the electronic device EA may include devices such as monitors, mobile phones, tablet personal computers (PCs), navigation devices, and game consoles. However, an embodiment of the electronic device EA is illustrative, and is not limited to any one of the above describes examples. In an embodiment, the electronic device EA is illustrated as a mobile phone.

The electronic device EA may have a rectangular shape having short sides extending in a first direction DR1 and long sides extending in a second direction DR2 intersecting the first direction DR1 on a plan view. However, the present disclosure is not limited thereto, and the electronic device EA may have various shapes such as a circle or a polygon on a plan view.

In an embodiment, a third direction DR3 may be a direction perpendicular to a plane formed by the first direction DR1 and the second direction DR2. A front surface (or an upper surface) and a rear surface (or a lower surface) of each of members constituting the electronic device EA may be opposite to each other in the third direction DR3, and a normal direction of each of the front surface and the rear surface may be substantially parallel to the third direction DR3. A separation distance between the front surface and the rear surface in the third direction DR3 may correspond to a thickness of the member.

In the present specification, the wording "on a plan view" may refer to a state viewed in the third direction DR3. In the present specification, the wording "on a cross section" may be refer to a state viewed from the first direction DR1 or the second direction DR2. Directions indicated by the first to third directions DR1, DR2, and DR3 are relative concepts and may be changed to other directions.

The electronic device EA may be rigid or flexible. The wording "flexible" may mean a property that may be bent and include a structure that is completely folded and a structure that may be bent by several nanometers. For example, the flexible electronic device EA may include a curved electronic device, a rollable electronic device, or a foldable electronic device.

The electronic device EA may display the image IM through a display surface FS parallel to the first direction DR1 and the second direction DR2. The image IM may include a still image as well as a dynamic image. In FIG. 1, a watch and icons are illustrated as an example of the image IM.

The display surface FS of the electronic device EA may include only a flat surface or may further include a curved surface bent from at least one side of the flat surface. The display surface FS may correspond to a front surface of the electronic device EA, and at the same time, may correspond to a front surface of a window WM. Hereinafter, the same reference numeral is used for the display surface FS of the electronic device EA and the front surface FS of the window WM.

The electronic device EA according to an embodiment may detect the external input TC applied from the outside. The external input TC may include various types of inputs such as a force, a pressure, a temperature, or light. In an embodiment, the external input TC is illustrated as a hand of a user that is applied to the front surface of the electronic device EA. However, this is just an example, and the external input TC may include an input, which is applied close to the electronic device EA, such as contact with a pen or hovering.

The electronic device EA may detect an input of the user through the display surface FS on the front surface and respond to the detected input signal. However, an area of the electronic device EA that detects the external input TC is not limited to the front surface of the electronic device EA and may be changed according to a design of the electronic device EA. For example, the electronic device EA may detect the input of the user applied to a side surface or rear surface of the electronic device EA.

The electronic device EA may include the window WM, a display module DM, an electronic module ELM, a power supply module PSM, and a housing HAU. The window WM and the housing HAU may be coupled to each other to constitute an exterior of the electronic device EA.

The window WM may be disposed on the display module DM. The window WM may cover a front surface IS of the display module DM and protect the display module DM from external impacts and scratches. The window WM may be coupled to the display module DM through an adhesive layer.

The window WM may include an optically transparent insulating material. For example, the window WM may include glass or a synthetic resin as a base film. The window WM may have a single-layer structure or a multi-layer structure. For example, the multi-layered window WM may include synthetic resin films bonded with an adhesive or may include a glass film and a synthetic resin film bonded with an adhesive. The window WM may further include functional layers, such as an anti-fingerprint layer, a phase control layer, and a hard coating layer, which are arranged on the transparent base film.

The front surface FS of the window WM may correspond to the front surface of the electronic device EA. The front surface FS of the window WM may include a transmissive area TA and a bezel area BZA.

The transmissive area TA may be an optically transparent area. The transmissive area TA may transmit the image IM provided by the display module DM. In an embodiment, the transmissive area TA is illustrated as a quadrangular shape, but the present disclosure is not limited thereto, and the transmissive area TA may have various shapes.

The bezel area BZA may be an area having lower light transmittance than that of the transmissive area TA. The bezel area BZA may correspond to an area on which a material having a predetermined color is printed. The bezel area BZA may prevent transmission of light to prevent one component of the display module DM that overlaps the bezel area BZA from being visually recognized from the outside.

The bezel area BZA may be adjacent to the transmissive area TA. A shape of the transmissive area TA may be substantially defined by the bezel area BZA. For example, the bezel area BZA may be disposed outside the transmissive area TA and surround the transmissive area TA. However, this is merely an example, and the bezel area BZA may be adjacent to only one side of the transmissive area TA or may not be disposed on the front surface but on the side surface of the electronic device EA. Further, the bezel area BZA may be omitted.

The display module DM may be disposed between the window WM and the housing HAU. The display module DM may display the image IM and detect the external input TC. The image IM may be displayed on the front surface IS of the display module DM. The front surface IS of the display module DM may include an active area AA and a peripheral area NAA.

The active area AA may be an area that is activated according to an electric signal. For example, the active area AA may be an area on which the image IM is displayed. Additionally, the active area AA may be an area in which the external input TC is detected. The active area AA may at least partially overlap the transmissive area TA. Accordingly, the user may visually recognize the image IM or provide the external input TC through the transmissive area TA. However, this is just an example. For example, an area of the active area AA, on which the image IM is displayed, and an area of the active area AA, on which the external input TC is detected, may be separated from each other, and the present disclosure is not limited to any one embodiment.

The peripheral area NAA may be adjacent to the active area AA. For example, the peripheral area NAA may surround the active area AA. A driving circuit or driving wiring line for driving the active area AA may be disposed in the peripheral area NAA. The peripheral area NAA may at least partially overlap the bezel area BZA, and components arranged in the peripheral area NAA may be prevented from being visually recognized from the outside by the bezel area BZA.

The display module DM may include a display panel and an input detection unit. The display panel may display the image IM, and the input detection unit may detect the external input TC. A detailed description thereof will be described below.

A portion of the display module DM may be bent about a bending axis extending in the first direction DR1. In other words, the portion of the display module DM may be bent toward a rear surface of the display module DM, corresponding to the active area AA. A flexible circuit board FCB may be connected to the bent portion of the display module DM, and accordingly, the flexible circuit board FCB may overlap the display module DM on a plan view.

The flexible circuit board FCB may be disposed on one side of the display module DM and electrically connected to the display module DM. The flexible circuit board FCB may generate an electrical signal provided to the display module DM or receive a signal generated by the display module DM to calculate a resultant value including information on a position where the external input TC is detected or an intensity of the external input TC.

The electronic module ELM and the power supply module PSM may be arranged below the display module DM. The electronic module ELM and the power supply module PSM may be electrically connected through a separate circuit board.

The power supply module PSM may supply power required for operating the electronic device EA. For example, the power supply module PSM may include a battery module.

The electronic module ELM may include various functional modules for operating the electronic device EA. For example, the electronic module ELM may include a control module, a wireless communication module, an image input module, a sound input module, a sound output module, a memory, an optical module, an external interface module, and the like. The electronic module ELM may include a main circuit board, and the functional modules of the electronic module ELM may be mounted on the main circuit board or electrically connected to the main circuit board through a separate circuit board.

The control module of the electronic module ELM may control an overall operation of the electronic device EA. For example, the control module may activate or deactivate the display module DM in accordance with the input of the user. The control module may include at least one microprocessor. The optical module of the electronic module ELM may include a camera module, a proximity sensor, a biometric sensor that recognizes a portion of a body of the user (for example, a fingerprint, an iris, or a face), a lamp that outputs light, and the like.

The housing HAU may be coupled to the window WM to provide an internal space in which the display module DM, the electronic module ELM, the power supply module PSM, and the flexible circuit board FCB are accommodated. The housing HAU may include a material having a relatively high rigidity. For example, the housing HAU may include a plurality of frames and/or plates made of glass, plastic, or metal or combinations thereof. The housing HAU may protect components of the electronic device EA accommodated in the housing HAU by absorbing an impact applied from the outside or preventing foreign substances/moisture from penetrating from the outside.

Figure 3:
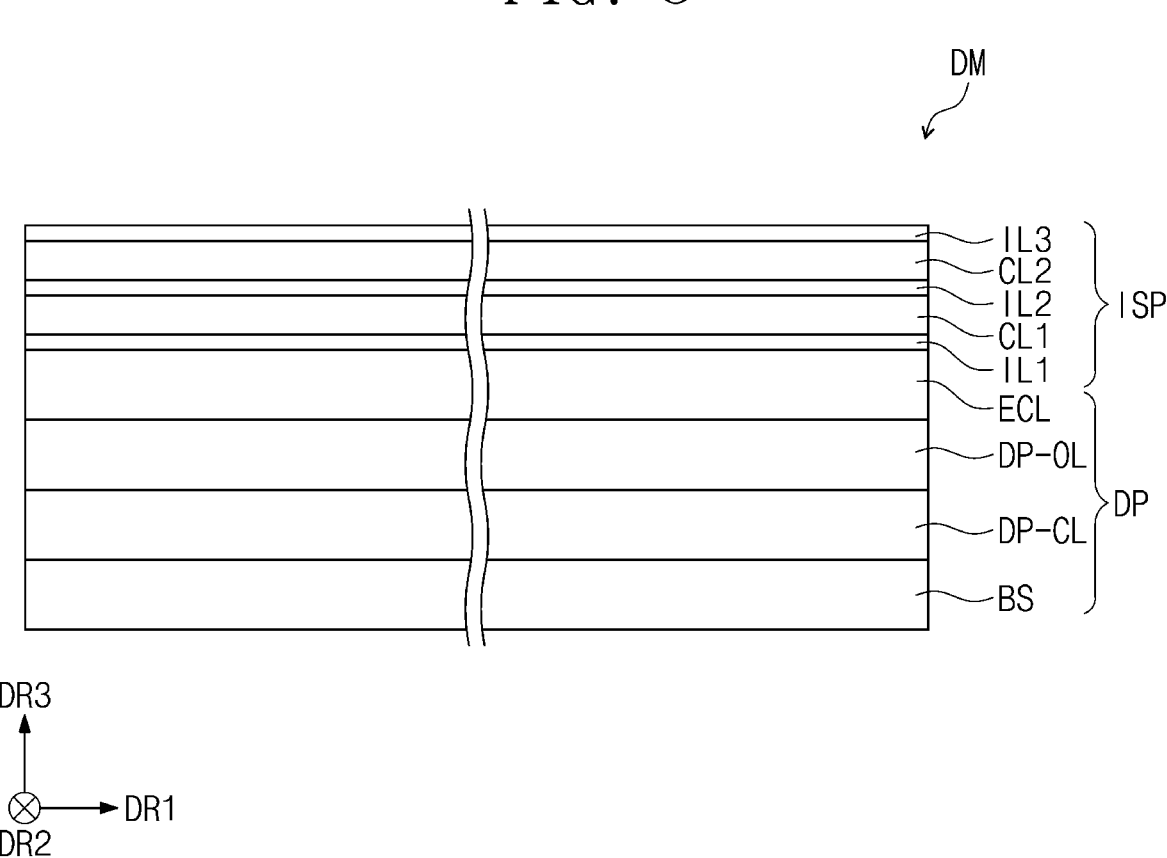
FIG. 3 is a cross-sectional view of a display module according to an embodiment of the present disclosure.

FIG. 3 is a cross-sectional view of the display module DM according to an embodiment of the present disclosure.

Referring to FIG. 3, the display module DM may include a display panel DP and an input detection unit ISP. The input detection unit ISP may be disposed on the display panel DP. For example, the input detection unit ISP may be directly disposed on the display panel DP. In an embodiment, the wording "the input detection unit ISP is directly disposed on the display panel DP" may mean that the input detection unit ISP is formed on the display panel DP through a subsequent process, and thus, the input detection unit ISP and the display panel DP are coupled without a separate adhesive layer. In other words, components of the input detection unit ISP may be formed on a base surface provided by the display panel DP.

The display panel DP may display an image according to the electrical signal. The display panel DP according to an embodiment may be a light emitting display panel, but the present disclosure is not particularly limited thereto. For example, the display panel DP may be an organic light emitting display panel, an inorganic light emitting display panel, or a quantum dot light emitting display panel. A light emitting layer of the organic light emitting display panel may contain an organic light emitting material, and a light emitting layer of the inorganic light emitting display panel may include an inorganic light emitting material. A light emitting layer of the quantum dot light emitting display panel may include a quantum dot and a quantum rod. Hereinafter, the display panel DP will be described as the organic light emitting display panel.

The display panel DP may include a base substrate BS, a circuit layer DP-CL, a display element layer DP-OL, and an encapsulation layer ECL that are sequentially stacked in the third direction DR3.

The base substrate BS may be a rigid substrate or a flexible substrate that may be bent, folded, and/or rolled. For example, the base substrate BS may be a glass substrate, a metal substrate, a polymer substrate, or the like. The base substrate BS may provide the base surface on which the circuit layer DP-CL is disposed.

The base substrate BS may include an inorganic layer, an organic layer, and a composite material layer. The base substrate BS may have a single-layer structure or a multi-layer structure. For example, the multi-layered base substrate BS may include synthetic resin layers and a multi-layered or single-layered inorganic layer disposed between the synthetic resin layers. The synthetic resin layer may include acrylic resin, methacrylic resin, polyisoprene, vinyl resin, epoxy resin, urethane resin, cellulose resin, siloxane resin, polyamide resin, perylene resin, or the like, but the material of the synthetic resin layer is not limited thereto.

The circuit layer DP-CL may be disposed on the base substrate BS. The circuit layer DP-CL may include at least one insulating layer, a semiconductor pattern, and a conductive pattern. The insulating layer, the semiconductor pattern, and the conductive pattern included in the circuit layer DP-CL may form driving elements such as transistors, signal lines, and pads.

The display element layer DP-OL may be disposed on the circuit layer DP-CL. For example, the display element layer DP-OL may be in direct contact with the circuit layer DP-CL. The display element layer DP-OL may include light emitting elements, each of which emits light. For example, the light emitting elements may include an organic light emitting element, an inorganic light emitting element, a micro light emitting diode (LED), a nano LED, or the like. The light emitting elements of the display element layer DP-OL are electrically connected to the driving elements of the circuit layer DP-CL and may thus emit light according to electrical signals provided by the driving elements.

The encapsulation layer ECL may be disposed on the display element layer DP-OL to seal the light emitting elements. For example, the encapsulation layer ECL may be in direct contact with the display element layer DP-OL. The encapsulation layer ECL may include at least one thin film for improving optical efficiency of the display element layer DP-OL or protecting the display element layer DP-OL. For example, the encapsulation layer ECL may include at least one of an inorganic film and an organic film. The inorganic film of the encapsulation layer ECL may protect the light emitting elements from moisture/oxygen. The organic film of the encapsulation layer ECL may protect the light emitting elements from foreign substances such as dust particles.

The input detection unit ISP may detect an external input and provide an input signal including information on the external input so that the display panel DP may display an image corresponding to the external input. The input detection unit ISP may be driven using various methods such as a capacitive method, a resistive film method, an infrared method, a sonic method, or a pressure method, and the driving method of the input detection unit ISP is not limited to any one method as long as the input detection unit ISP is capable of detecting the external input. In an embodiment, the input detection unit ISP is described as an input detection panel driven in the capacitive method.

The input detection unit ISP may include a base layer IL1, a first detection conductive layer CL1, a first detection insulating layer IL2, a second detection conductive layer CL2, and a second detection insulating layer IL3, which are stacked in the third direction DR3. In particular, the base layer IL1, the first detection conductive layer CL1, the first detection insulating layer IL2, the second detection conductive layer CL2, and the second detection insulating layer IL3 are sequentially stacked in the third direction DR3. The base layer IL1 of the input detection unit ISP may be in contact with the encapsulation layer ECL. However, an embodiment is not limited thereto, and at least one of the base layer IL1 and the second detection insulating layer IL3 may be omitted.

Each of the first detection conductive layer CL1 and the second detection conductive layer CL2 may have a single-layered or multi-layered structure. The conductive layer having the multi-layered structure may include at least two of transparent conductive layers and metal layers. The multi-layered conductive layer may include metal layers including different metals. The transparent conductive layer may include at least one of indium tin oxide (ITO), indium zinc oxide (IZO), zinc oxide (ZnO), indium tin zinc oxide (ITZO), poly(3,4-ethylenedioxythiophene) (PEDOT), a metal nano wire, and a graphene. The metal layer may include at least one of molybdenum, silver, titanium, copper, aluminum, and alloys thereof. For example, each of the first detection conductive layer CL1 and the second detection conductive layer CL2 may have a two-layered structure, for example, a two-layered structure of the ITO/copper, but the present disclosure is not limited thereto. For example, each of the first detection conductive layer CL1 and the second detection conductive layer CL2 may have a three-layered structure of titanium/aluminum/titanium.

Each of the first detection conductive layer CL1 and the second detection conductive layer CL2 may have detection conductive patterns. The detection conductive patterns of the first detection conductive layer CL1 and the second detection conductive layer CL2 may form detection electrodes constituting the input detection unit ISP and detection lines connected thereto.

Each of the base layer IL1, the first detection insulating layer IL2, and the second detection insulating layer IL3 may include at least one of an inorganic film and an organic film. For example, the inorganic film may include at least one of aluminum oxide, titanium oxide, silicon oxide, silicon oxynitride, zirconium oxide, and hafnium oxide, and the organic film may include at least one of acrylic resin, methacrylic resin, polyisoprene, vinyl resin, epoxy resin, urethane resin, cellulose resin, siloxane resin, polyimide resin, polyamide resin, and perylene resin. However, the materials of the inorganic film and the organic film are not limited to the above example. In an embodiment, the base layer IL1 may include the inorganic film, and the first detection insulating layer IL2, and the second detection insulating layer IL3 may include the organic films, but an embodiment is not limited thereto.

Figure 4:
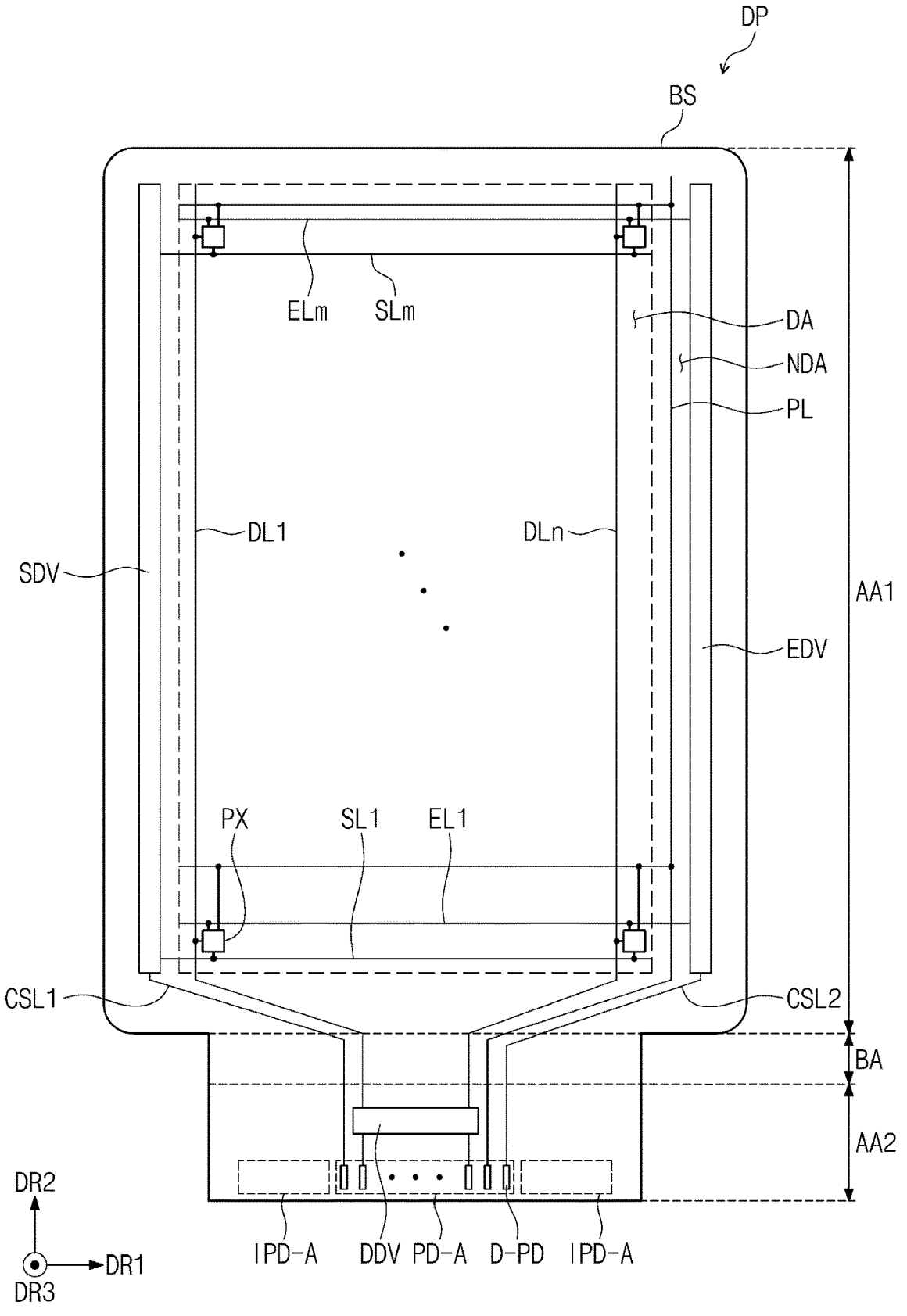
FIG. 4 is a plan view of a display panel according to an embodiment of the present disclosure.

FIG. 4 is a plan view of the display panel DP according to an embodiment of the present disclosure.

Referring to FIG. 4, the display panel DP may include the base substrate BS, pixels PX, signal lines SL1 to SLm, DL1 to DLn, EL1 to ELm, CSL1, CSL2, and PL electrically connected to the pixels PX, a scan driver SDV, an emission driver EDV, a data driver DDV, and display pads D-PD.

The base substrate BS may provide a base surface on which the electrical elements and the lines of the display panel DP are arranged. The base substrate BS may include a first base area AA1, a bending area BA, and a second base area AA2 divided in the second direction DR2. The bending area BA may extend from the first base area AA1 in the second direction DR2. The second base area AA2 may extend from the bending area BA in the second direction DR2. Thus, the first base area AA1 and the second base area AA2 may be spaced apart from each other with the bending area BA interposed therebetween.

The first base area AA1 may include a display area DA. The display area DA may be an area in which light emitting elements of the pixels PX are arranged. Accordingly, the pixels PX may display the image through the display area DA. The display area DA may correspond to the active area AA (see FIG. 2) of the display module DM (see FIG. 2) and overlap the transmissive area TA (see FIG. 2).

The first base area AA1, the bending area BA, and the second base area AA2 except for the display area DA may be referred to as a non-display area NDA. The non-display area NDA may be an area which is adjacent to the display area DA and on which the image is not displayed. The non-display area NDA may surround the display area DA. The scan driver SDV for driving the pixels PX, the emission driver EDV, the data driver DDV, and the display pads D-PD electrically connected to the signal lines SL1 to SLm, DL1 to DLn, EL1 to ELm, CSL1, CSL2, and PL may be arranged in the non-display area NDA. The signal lines SL1 to SLm, DL1 to DLn, EL1 to ELm, CSL1, CSL2, and PL electrically connected to the pixels PX may be extended to and arranged in the non-display area NDA.

The bending area BA may be an area that is bent about the bending axis extending in the first direction DR1. In other words, the bending area BA may be bent toward a rear surface of the display panel DP corresponding to the first base area AA1. By bending the bending area BA, the second base area AA2 extending from one side of the bending area BA may overlap the first base area AA1 on a plan view. In other words, the second base area AA2 may be disposed on the rear surface of the display panel DP corresponding to the first base area AA1.

Widths of the bending area BA and the second base area AA2 in the first direction DR1 may be smaller than a width of the first base area AA1. Since the width of the bending area BA is smaller than the width of the first base area AA1 in a direction parallel to the bending axis, the bending area BA may be easily bent. However, this is just an example, and at least one of the widths of the bending area BA and the second base area AA2 in the first direction DR1 may be the same as the width of the first base area AA1, and the present disclosure is not limited thereto.

The second base area AA2 may be positioned below the first base area AA1 and be flat. The second base area AA2 may be an area in which signal lines, extending from the first base area AA1 via the bending area BA to the display pads D-PD, among the signal lines SL1 to SLm, DL1 to DLn, EL1 to ELm, CSL1, CSL2, and PL, and the data driver DDV are arranged.

An area in which the display pads D-PD are arranged and an area in which detection pads I-PD (see FIG. 5), which will be described below, are arranged may be classified into a display pad area PD-A and a detection pad area IPD-A. FIG. 4 illustrates that the display pad area PD-A and the detection pad area IPD-A are divided in the first direction DR1. For example, the detection pad area IPD-A may be provided adjacent to opposite sides of the second base area AA2 in the first direction DR1, and the display pad area PD-A may be provided in a central portion adjacent to a lower end of the second base area AA2. However, an embodiment is not necessarily limited thereto, and the arrangement positions of the display pads D-PD and the detection pads I-PD (see FIG. 5) may be variously changed.

Figure 5:
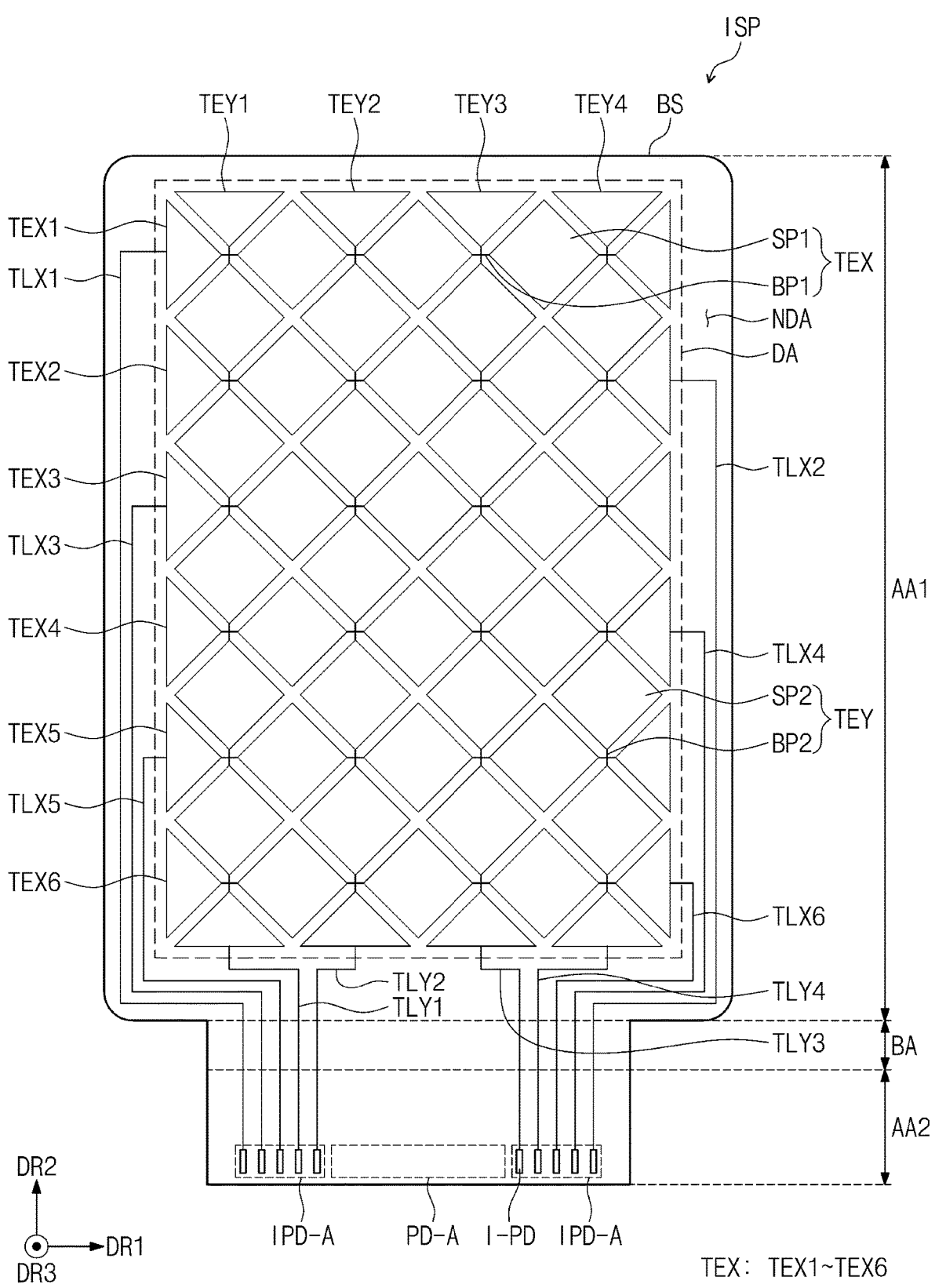
FIG. 5 is a plan view of an input detection unit according to an embodiment of the present disclosure.

The flexible circuit board FCB (see FIG. 2) may be disposed on the second base area AA2 with the display pads D-PD and the detection pads I-PD (see FIG. 5) and electrically connected to the display pads D-PD and the detection pads I-PD (see FIG. 5). The flexible circuit board FCB (see FIG. 2) disposed adjacent to the lower end of the second base area AA2 may be positioned on the rear surface of the display panel DP by bending the bending area BA. Since the second base area AA2 and the flexible circuit board FCB (see FIG. 2) are positioned below the first base area AA1 on the front surface of the electronic device EA (see FIG. 2), a bezel area of the electronic device EA (see FIG. 2) may be reduced.

Each of the pixels PX may include a pixel driving circuit including transistors (for example, a switching transistor, a driving transistor, or the like) and at least one capacitor and a light emitting element electrically connected to the pixel driving circuit. The pixels PX may generate light in correspondence to electrical signals applied to the pixels PX and display an image through the display area DA. According to an embodiment, some of the pixels PX may include a transistor disposed on the non-display area NDA, and the present disclosure is not limited thereto.

The scan driver SDV and the emission driver EDV may be disposed on the non-display area NDA corresponding to the first base area AA1. The data driver DDV may be disposed on the non-display area NDA corresponding to the second base area AA2. In an embodiment, the data driver DDV may be provided in the form of an integrated circuit chip mounted on the non-display area NDA of the display panel DP. However, the present disclosure is not limited thereto, and the data driver DDV may be mounted on the flexible circuit board FCB (see FIG. 2).

The signal lines SL1 to SLm, DL1 to DLn, EL1 to ELm, CSL1, CSL2, and PL may include the scan lines SL1 to SLm, the data lines DL1 to DLn, the light emission lines EL1 to ELm, the first and second control lines CSL1 and CSL2, and the power line PL. Here, "m" and "n" represent natural numbers.

The data lines DL1 to DLn may be insulated from and intersect the scan lines SL1 to SLm and the light emission lines EL1 to ELm. For example, the scan lines SL1 to SLm may extend in the first direction DR1 and may be electrically connected to the scan driver SDV. The data lines DL1 to DLn may extend in the second direction DR2 and may be electrically connected to the data driver DDV. The light emission lines EL1 to ELm may extend in the first direction DR1 and may be electrically connected to the emission driver EDV.

The power line PL my include a portion extending in the first direction DR1 and a portion extending in the second direction DR2. A portion of the power line PL extending in the first direction DR1 and a portion of the power line PL extending in the second direction DR2 may be arranged on different layers or arranged on the same layer in an integral shape. The portion of the power line PL extending in the first direction DR1 may be electrically connected to the pixels PX and the portion of the power line PL extending in the second direction DR2. The portion of the power line PL extending in the second direction DR2 may be disposed in the non-display area NDA and may be electrically connected to the display pads D-PD via the bending area BA and the second base area AA2 from the first base area AA1. The power line PL may provide a first voltage to the pixels PX.

The first control line CSL1 may be electrically connected to the scan driver SDV and may extend toward the lower end of the second base area AA2 via the bending area BA. The second control line CSL2 may be electrically connected to the emission driver EDV and may extend toward the lower end of the second base area AA2 via the bending area BA.

The display pads D-PD may be arranged adjacent to the lower end of the second base area AA2. On the second base area AA2, the display pads D-PD may be disposed closer to a lower end of the base substrate BS than the data driver DDV. For example, the data driver DDV may be disposed between the display pads D-PD and the bending area BA. The display pads D-PD may be spaced apart from each other in the first direction DR1. The power line PL, the first control line CSL1, and the second control line CSL2 may be electrically connected to corresponding display pads D-PD among the display pads D-PD. The data lines DL1 to DLn may be electrically connected to corresponding display pad D-PD among the display pads D-PD through the data driver DDV.

The display pads D-PD may be electrically connected to the flexible circuit board FCB (see FIG. 2) through an anisotropic conductive adhesive layer, and the electrical signal provided by the flexible circuit board FCB (see FIG. 2) may be transmitted to the display panel DP through the display pads D-PD. However, a connection method between the display pads D-PD and the flexible circuit board FCB (see FIG. 2) is not limited thereto.

The scan driver SDV may generate scan signals in response to a scan control signal. The scan signals may be applied to the pixels PX through the scan lines SL1 to SLm. The data driver DDV may generate data voltages corresponding to image signals in response to a data control signal. The data voltages may be applied to the pixels PX through the data lines DL1 to DLn. The emission driver EDV may generate light emission signals in response to a light emission control signal. The light emission signals may be applied to the pixels PX through the light emission lines EL1 to ELm.

The pixels PX may receive the data voltages in response to the scan signals. The pixels PX may generate an image by emitting light having a luminance corresponding to the data voltages in response to the light emission signals. Light emission times of the pixels PX may be controlled by the light emission signals.

FIG. 5 is a plan view of the input detection unit ISP according to an embodiment of the present disclosure. For convenience of description, FIG. 5 briefly illustrates configurations of the input detection unit ISP disposed on the base substrate BS.

In an embodiment, the input detection unit ISP may be driven in a mutual-capacitive type method. Referring to FIG. 5, the input detection unit ISP may include first detection electrodes TEX (TEX1, TEX2, TEX3, TXE4, TEX5 and TEX6), second detection electrodes TEY (TEY1, TEY2, TEY3 and TEY4), first detection lines TLX1, TLX2, TLX3, TLX4, TLX5 and TLX6, second detection lines TLY1, TLY2, TLY3 and TLY4, and the detection pads I-PD. However, the present disclosure is not limited thereto, and the input detection unit ISP may be driven in a self-capacitive type method.

Each of the first detection electrodes TEX may extend in the first direction DR1, and the first detection electrodes TEX may be arranged in the second direction DR2. FIG. 5 illustrates six first detection electrodes TEX1 to TEX6. However, the number of the first detection electrodes TEX included in the input detection unit ISP is not limited thereto. One first detection electrode TEX may include first detection patterns SP1 arranged in the first direction DR1 and first connection patterns BP1 connecting the first detection patterns SP1.

Each of the second detection electrodes TEY may extend in the second direction DR2, and the second detection electrodes TEY may be arranged in the first direction DR1. FIG. 5 illustrates four second detection electrodes TEY1 to TEY4. However, the number of the second detection electrodes TEY included in the input detection unit ISP is not limited thereto. One second detection electrode TEY may include second detection patterns SP2 arranged in the first direction DR1 and second connection patterns BP2 connecting the second detection patterns SP2.

The first detection electrodes TEX and the second detection electrodes TEY may be electrically insulated from each other. The input detection unit ISP may detect the external input through a change in a capacitance between the first detection electrodes TEX and the second detection electrodes TEY. The first detection electrodes TEX and the second detection electrodes TEY may be arranged in an area of the base substrate BS, corresponding to the display area DA. Accordingly, the electronic device EA (see FIG. 1) may display an image through the display area DA, and at the same time, detect the external input applied to the display area DA.

The first detection lines TLX1 to TLX6 may be arranged on the non-display area NDA and electrically connected to the first detection electrodes TEX1 to TEX6, respectively. Some of the first detection lines TLX1 to TLX6 may be arranged on a left side of the non-display area NDA, and the other first detection lines TLX1 to TLX6 may be arranged on a right side of the non-display area NDA. For example, the first detection lines TLX1, TLX3, and TLX5 connected to the first detection electrodes TEX1, TEX3, and TEX5 arranged in odd-numbered rows may be connected to left sides of the first detection electrodes TEX1, TEX3, and TEX5, respectively, and the first detection lines TLX2, TLX4, and TLX6 connected to the first detection electrodes TEX2, TEX4, and TEX6 arranged in even-numbered rows may be connected to right sides of the first detection electrodes TEX2, TEX4, and TEX6, respectively. However, the arrangement of the first detection lines TLX1 to TLX6 is not limited thereto, and all the first detection lines TLX1 to TLX6 may be arranged on the left side of the non-display area NDA or all the first detection lines TLX1 to TLX6 may be arranged on the right side of the non-display area NDA.

Each of the first detection lines TLX1 to TLX6 may extend from the first base area AA1 via the bending area BA toward the second base area AA2. The first detection lines TLX1 to TLX6 may be electrically connected to the detection pads I-PD arranged on the second base area AA2.

The second detection lines TLY1 to TLY4 may be arranged on the non-display area NDA and electrically connected to the second detection electrodes TEY1 to TEY4, respectively. Some of the second detection lines TLY1 to TLY4 may be arranged on the left side of the non-display area NDA, and the other second detection lines TLY1 to TLY4 may be arranged on the right side of the non-display area NDA. For example, the second detection lines TLY1 and TLY2 electrically connected to the second detection electrodes TEY1 and TEY2 arranged on a left side in the first direction DR1 among the second detection electrodes TEY1 to TEY4 may be arranged on a left side of the first base area AA, and the second detection lines TLY3 and TLY4 electrically connected to the second detection electrodes TEY3 and TEY4 arranged on a right side may be arranged on a right side of the first base area AA1. However, the arrangement of the second detection lines TLY1 to TLY4 is not limited thereto.

Each of the second detection lines TLY1 to TLY4 may extend from an area adjacent to a lower end of the first base area AA1 via the bending area BA toward the second base area AA2. The second detection lines TLY1 to TLY4 may be electrically connected to the detection pads I-PD arranged on the second base area AA2.

Some of the detection pads I-PD may be arranged on a left side of the second base area AA2 in the first direction DR1, and the other detection pads I-PD may be arranged on a right side of the second base area AA2. For example, the detection pads I-PD may be divided into two spaced groups with the display pad area PD-A interposed therebetween. However, the arrangement of the detection pads I-PD is not limited thereto.

The detection pads I-PD may be arranged on the same layer as the display pads D-PD (see FIG. 4). The detection pads I-PD may be arranged on a different layer from the first and second detection lines TLX1 to TLX6 and TLY1 to TLY4 and connected through a contact hole. However, the present disclosure is not limited thereto, and the detection pads I-PD may be arranged on a different layer from the display pads D-PD (see FIG. 4). For example, the detection pads I-PD may be arranged on the same layer as the first and second detection lines TLX1 to TLX6 and TLY1 to TLY4 and integrally formed.

The first and second detection lines TLX1 to TLX6 and TLY1 to TLY4 may be arranged above components of the display panel DP (see FIG. 4) on an area corresponding to the non-display area NDA of the base substrate BS. Accordingly, the first and second detection lines TLX1 to TLX6 and TLY1 to TLY4 may overlap components of the display panel DP (see FIG. 4) on the bending area BA and the second base area AA2.

Figure 6:
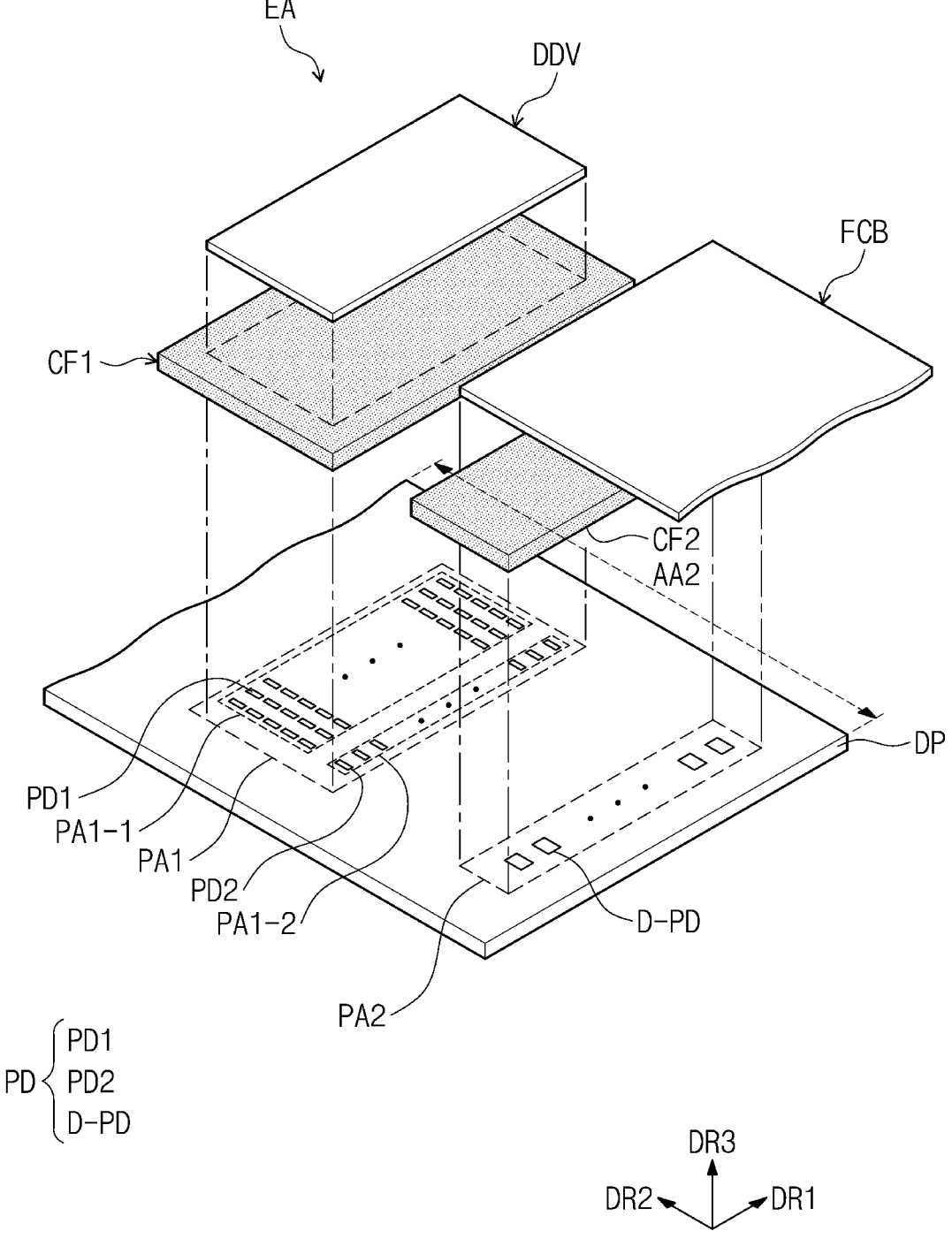
FIG. 6 is a perspective view of the electronic device according to an embodiment of the present disclosure.

FIG. 6 is a perspective view of the electronic device EA according to an embodiment of the present disclosure. FIG. 6 briefly illustrates some components of the electronic device EA disposed to correspond to the second base area AA2.

The second base area AA2 corresponds to a partial are of the non-display area NDA (see FIG. 4). As illustrated in FIG. 6, among the non-display area NDA or the second base area AA2, an area to which the data driver DDV is bonded may be a first pad area PA1, and an area to which the flexible circuit board FCB is bonded may be a second pad area PA2.

The data driver DDV may be bonded to the first pad area PA1 through a first conductive adhesive layer CF1, and the flexible circuit board FCB may be bonded to the second pad area PA2 through a second conductive adhesive layer CF2. The first conductive adhesive layer CF1 may be in contact with the data driver DDV and the first pad area PA1 and the second conductive adhesive layer CF2 may be in contact with the flexible circuit board FCB and the second pad area PA2. Each of the first conductive adhesive layer CF1 and the second conductive adhesive layer CF2 may be provided as an anisotropic conductive adhesive. For example, each of the first conductive adhesive layer CF1 and the second conductive adhesive layer CF2 may include an adhesive resin and conductive particles dispersed in the adhesive resin.

However, the present disclosure is not limited thereto, and in an embodiment, at least one of the first conductive adhesive layer CF1 and the second conductive adhesive layer CF2 may be omitted. For example, the data driver DDV and the flexible circuit board FCB may be ultrasonically bonded on the first pad area PA1 and the second pad area PA2, respectively.

The display panel DP may include a plurality of pads PD. The plurality of pads PD may include first signal pads PD1, second signal pads PD2, and the display pads D-PD. The first signal pads PD1, the second signal pads PD2, and the display pads D-PD may be pads arranged on a signal transmission path.

The first signal pads PD1 may be input pads that are arranged to correspond to an output bump of the data driver DDV and receive a signal from the data driver DDV. The second signal pads PD2 may be output pads that are arranged to correspond to an input bump of the data driver DDV and input a signal to the data driver DDV. The display pads D-PD may be panel input pads that receive a signal from the flexible circuit board FCB.

The first signal pads PD1 may be electrically connected to the pixels PX (see FIG. 4) of the display panel DP through the signal lines and transmit or receive a signal to or from the pixels PX (see FIG. 4). The second signal pads PD2 may be electrically connected to corresponding display pads D-PD among the display pads D-PD through a signal wiring line, and the display pads D-PD and the second signal pads PD2 electrically connected to each other may transmit or receive a signal.

The first pad area PA1 may include a first sub-pad area PA-1 and a second sub-pad area PA1-2. The first sub-pad area PA1-1 may be an area in which the first signal pads PD1 are arranged. The second sub-pad area PA1-2 may be an area in which the second signal pads PD2 are arranged.

The first signal pads PD1 may be arranged inside the first sub-pad area PA1-1 in the first direction DR1 and the second direction DR2. The first signal pads PD1 arranged in the first direction DR1 among the first signal pads PD1 may be referred to as pad rows. FIG. 6 illustrates that the five pad rows are arranged in the second direction DR2. The arrangement of the first signal pads PD1 is not limited thereto as long as at least two pad rows are arranged in the second direction DR2.

The second signal pads PD2 may be arranged inside the second sub-pad area PA1-2 in the first direction DR1. The second signal pads PD2 may be arranged in one pad row. However, the arrangement of the second signal pads PD2 is not limited to thereto.

Figure 7:
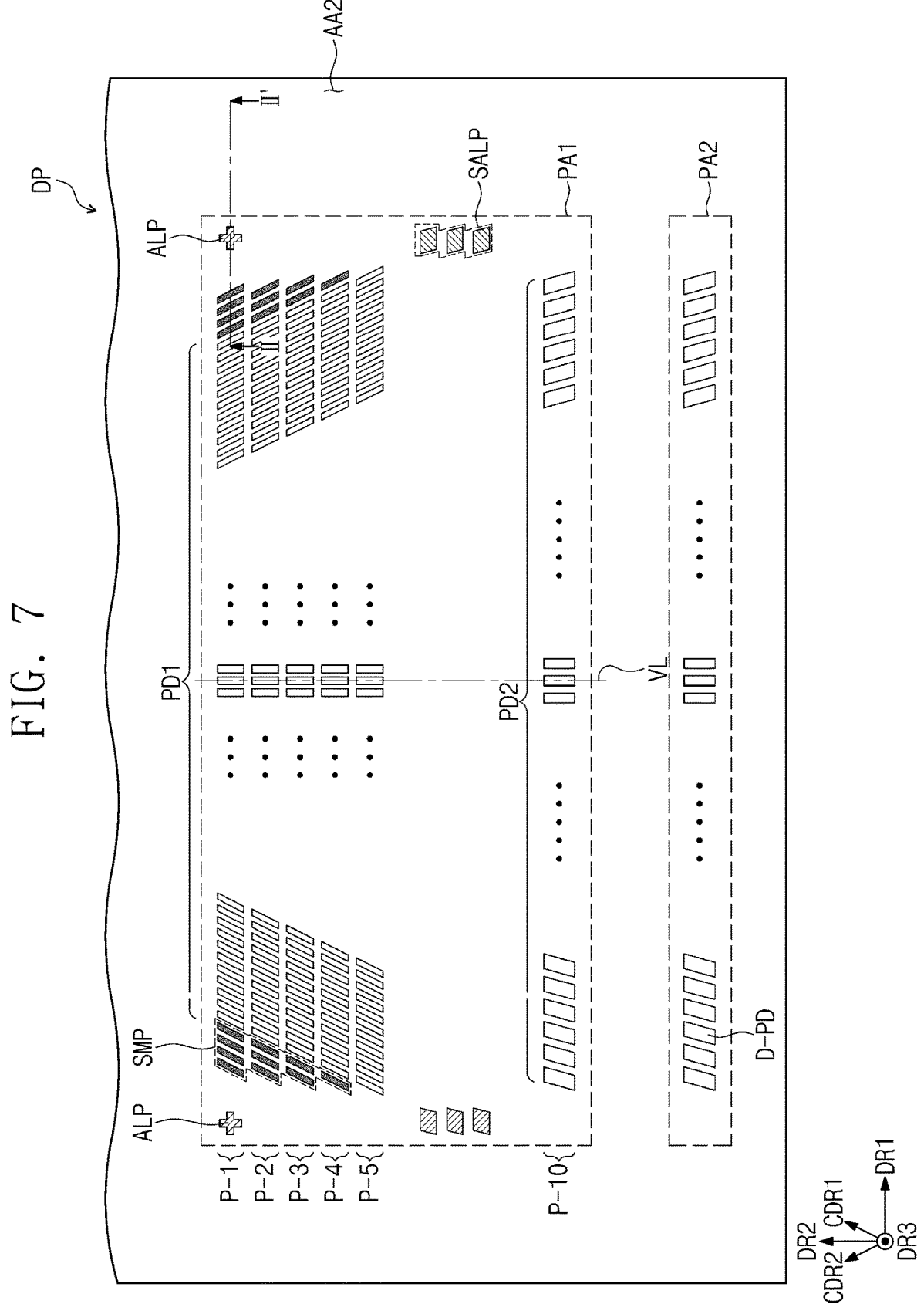
FIG. 7 is a plan view of the display panel according to an embodiment of the present disclosure.

FIG. 7 is a plan view of the display panel DP according to an embodiment of the present disclosure. FIG. 7 is a plan view of a portion of the display panel DP corresponding to the second base area AA2. The above description may be applied to respective components illustrated in FIG. 7.

FIG. 7 illustrates the first and second pad areas PA1 and PA2 according to an embodiment, in an enlarged fashion. The data driver DDV (see FIG. 6) may be bonded to the first pad area PA1, and the flexible circuit board FCB (see FIG. 6) may be bonded to the second pad area PA2.

Referring to FIG. 7, the first signal pads PD1 and the second signal pads PD2 may be arranged in the first pad area PA1. The first signal pads PD1 may be arranged in five pad rows P-1, P-2, P-3, P-4 and P-5 inside an area adjacent to an upper portion of the first pad area PA1. The five pad rows P-1 to P-5 may be referred to as first to fifth input pad rows P-1 to P-5. The second signal pads PD2 may be arranged in one pad row P-10 inside an area adjacent to a lower portion of the first pad area PA1. The one pad row P-10 may be referred to as the first output pad row P-10.

The first signal pads PD1 arranged at a central portion in the first direction DR1 among the first signal pads PD1 may be referred to as first central pads, and the first central pads may be arranged on a reference line VL. Each of the first central pads may extend in the second direction DR2. The first signal pads PD1 arranged on a left side and a right side of the reference line VL among the first signal pads PD1 may extend to have a predetermined slope with respect to the reference line VL. In other words, some of the first signal pads PD1 arranged on the left side and the right side of the reference line VL may be slanted. Some of the first signal pads PD1 arranged on the left side of the reference line VL may extend in a first oblique direction CDR1. The first signal pads PD1 arranged on the left side from the first central pads may extend to form an acute angle in a clockwise direction with respect to the reference line VL. Some of the first signal pads PD1 arranged on the right side of the reference line VL may extend in a second oblique direction CDR2. The first signal pads PD1 arranged on the right side from the first central pads may extend to form an acute angle in a counterclockwise direction with respect to the reference line VL.

The second signal pads PD2 arranged at a central portion in the first direction DR1 among the second signal pads PD2 may be referred to as second central pads, and the second central pads may be arranged on the reference line VL. The second central pads may extend in the second direction DR2. The second signal pads PD2 arranged on the left side and the right side of the reference line VL among the second signal pads PD2 may extend to have a predetermined slope with respect to the reference line VL. In other words, some of the second signal pads PD2 arranged on the left side and the right side of the reference line VL may be slanted. Some of the second signal pads PD2 arranged on the left side of the reference line VL may extend to have an acute angle in a clockwise direction with respect to the reference line VL, and some of the second signal pads PD2 arranged on the right side of the reference line VL may extend to have an acute angle in a counterclockwise direction with respect to the reference line VL.

The display panel DP may further include dummy pads SMP. The dummy pads SMP may be arranged inside the first pad area PAL. The dummy pads SMP may be electrically isolated pads and may be arranged to supplement an area between an edge of the second base area AA2 and the first signal pads PD1.

The dummy pads SMP may be arranged outside the outermost first signal pads PD1 in at least one row of the first to fifth input pad rows P-1 to P-5. The dummy pads SMP may be arranged adjacent to a left side and a right side of the first pad area PA1. FIG. 6 illustrates the dummy pads SMP arranged outside the first to fourth input pads P-1 to P-4 among the first to fifth input pads P-1 to P-5, but the arrangement of the dummy pads SMP is not limited thereto.

The dummy pads SMP may extend in a direction parallel to a direction in which the first signal pad PD1 disposed adjacent to the dummy pads SMP extends. For example, the dummy pads SMP may be slanted. The dummy pads SMP may form a pad row and may be arranged side by side in the first direction DR1 together with the first signal pads PD1 arranged in the first direction DR1.

The display panel DP may further include an alignment pad ALP. The alignment pad ALP may be disposed in the first pad area PA1. The alignment pad ALP may be provided as a plurality of alignment pads, and the alignment pads ALP may be arranged adjacent to left and right corners of the first pad area PA1.

The alignment pad ALP may be an identification mark or an alignment mark for aligning the data driver DDV (see FIG. 6) and the first pad area PA1 of the display panel DP in a process of bonding the data driver DDV (see FIG. 6) onto the first pad area PA1 of the display panel DP. FIG. 7 illustrates the cross-shaped alignment pad ALP, but the shape of the alignment pad ALP is not limited to any one shape as long as the data driver DDV (see FIG. 6) and the display panel DP are aligned, and for example, the alignment pad ALP may have a circular shape or polygonal shape.

In an embodiment, the dummy pads SMP and the alignment pad ALP may be formed through the same process, and the dummy pads SMP and the alignment pad ALP may include the same material. In an embodiment, at least one of the dummy pads SMP and the alignment pad ALP may include the same material as that of the first signal pads PD1. At least one of the dummy pads SMP and the alignment pad ALP may be formed through the same process as that of the first signal pads PD1.

The display panel DP may further include a sub-alignment pad SALP. The sub-alignment pad SALP may be disposed in the first pad area PAL. The sub-alignment pad SALP is provided as a plurality of sub-alignment pads SALP, some of the sub-alignment pads SALP may be arranged adjacent to the left side of the first pad area PA1, and the other sub-alignment pads SALP may be arranged adjacent to the right side of the first pad area PAL.

The sub-alignment pad SALP may be an identification mark or an alignment mark for aligning the data driver DDV (see FIG. 6) and the display panel DP or inspecting whether the alignment of the data driver DDV (see FIG. 6) and the display panel DP is proper in a process of bonding the data driver DDV (see FIG. 6) onto the first pad area PA1 of the display panel DP. FIG. 7 illustrates the quadrangular sub-alignment pad SALP, but the shape of the sub-alignment pad SALP is not limited to any one shape as long as the alignment between the data driver DDV (see FIG. 6) and the display panel DP may be identified, and for example, the sub-alignment pad SALP may have a circular shape or polygonal shape.

Figure 8A:
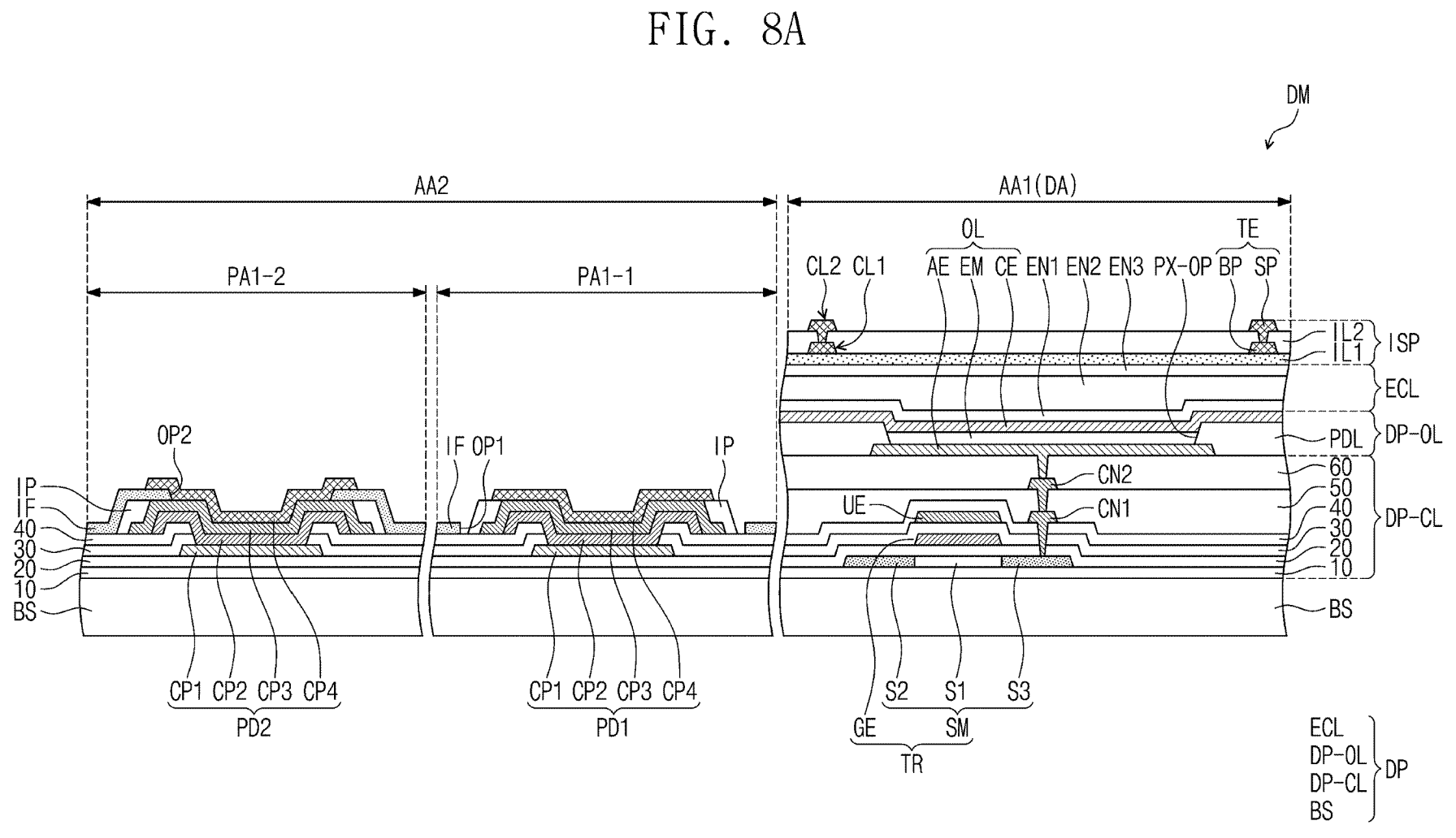
Figure 8B:
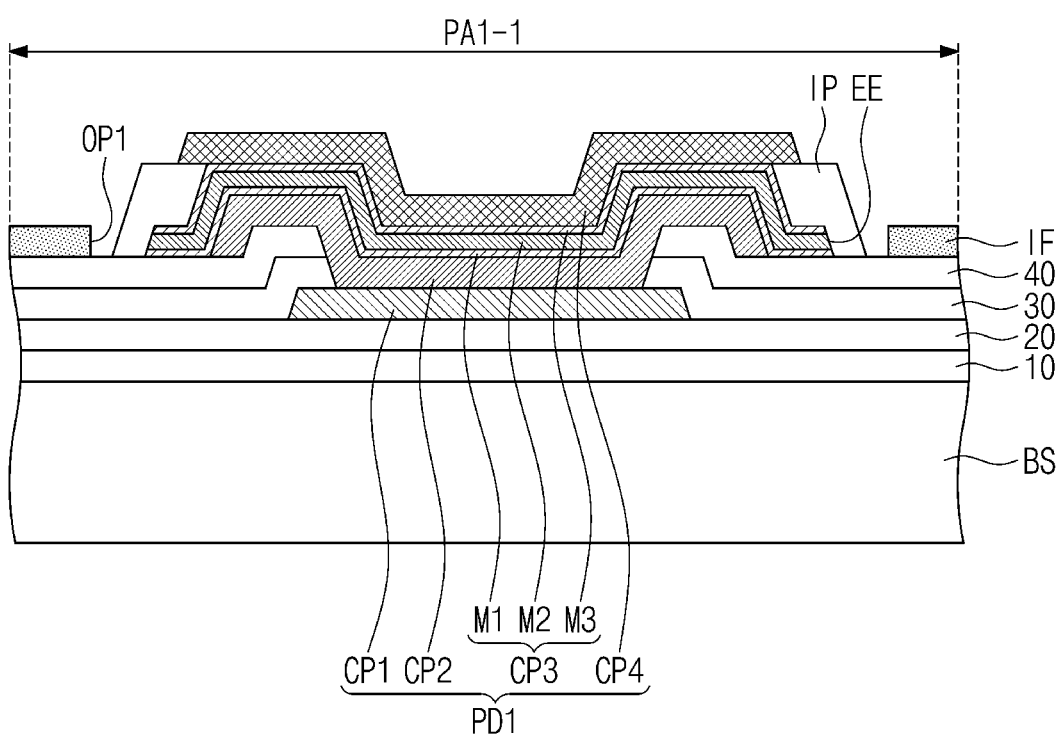
FIG. 8B is a cross-sectional view illustrating a part of the display module of FIG. 8A.

FIG. 8A is a cross-sectional view of the display module DM according to an embodiment of the present disclosure. FIG. 8B is a cross-sectional view illustrating a part of the display module DM of FIG. 8A. FIG. 8A illustrates a cross section of the pixel PX (see FIG. 4) disposed in the first base area AA1 and the first and second signal pads PD1 and PD2 arranged in the second base area AA2. FIG. 8B illustrates a cross section of the second base area AA2 corresponding to the first sub-pad area PA1-1.

Referring to FIGS. 8A and 8B, the display module DM may include the display panel DP and the input detection unit ISP disposed on the display panel DP. The above descriptions may be applied to respective components of the display module DM.

Referring to FIGS. 8A and 8B, the display panel DP may include the base substrate BS, the circuit layer DP-CL, the display element layer DP-OL, and the encapsulation layer ECL.

The base substrate BS may provide the base surface which has insulating properties and on which components of the display module DM are arranged. The base substrate BS may have flexibility to be bendable. As described above, the base substrate BS may include the first base area AA1, the bending area BA (see FIG. 4), and the second base area AA2, and the bending area BA (see FIG. 4) of the base substrate BS may be bent at a predetermined curvature.

The circuit layer DP-CL may include insulating layers 10, 20, 30, 40, 50 and 60 arranged on the base substrate BS, a transistor TR of the pixel PX (see FIG. 4), an upper electrode UE, and connection electrodes CN1 and CN2. The insulating layers 10 to 60 may include first to sixth insulating layers 10 to 60 that are sequentially stacked on the base substrate BS in a thickness direction. However, an embodiment of the insulating layers 10 to 60 included in the circuit layer DP-CL is not limited thereto and may be changed according to a configuration of the circuit layer DP-CL or a manufacturing process.

The first insulating layer 10 may be disposed on the base substrate BS. The first insulating layer 10 may be provided as a barrier layer and/or a buffer layer that prevents foreign substances from being introduced from the outside. The first insulating layer 10 may improve a coupling force between the base substrate BS and a semiconductor pattern SM and/or a conductive pattern of the circuit layer DP-CL. The first insulating layer 10 may include at least one of a silicon oxide layer and a silicon nitride layer. In an embodiment, the first insulating layer 10 may include silicon oxide layers and silicon nitride layers that are alternately stacked.

The pixel PX (see FIG. 4) may be disposed on the base substrate BS. The pixel PX (see FIG. 4) may be disposed to correspond to the display area DA of the first base area AA1. The pixel PX (see FIG. 5) may include the transistor TR and a light emission element OL.

The transistor TR may include the semiconductor pattern SM and a gate electrode GE. The semiconductor pattern SM may be disposed on the first insulating layer 10. The semiconductor pattern SM may include a channel S1, a source S2, and a drain S3. The semiconductor pattern SM may include a silicon semiconductor, and may include a single-crystal silicon semiconductor, a poly-silicon semiconductor, or an amorphous silicon semiconductor. The present disclosure is not limited thereto, and the semiconductor pattern SM may also include an oxide semiconductor. The semiconductor pattern SM according to an embodiment of the present disclosure may be formed of various materials as long as the materials have semiconductor properties, and is not limited to any one embodiment.

The semiconductor pattern SM may include a plurality of areas having different electrical properties according to whether the areas are doped or reduced. For example, the semiconductor pattern SM may include an area having high conductivity due to doping or reduction of a metal oxide, and the area having high conductivity may serve as an electrode of the transistor TR or a signal wiring line. For example, the area having high conductivity may correspond to the source S2 and the drain S3 of the transistor TR. The semiconductor pattern SM may include an area that is not doped and thus has relatively low conductivity, which may correspond to the channel S1 (or an active) of the transistor TR.

The second insulating layer 20 may be disposed on the first insulating layer 10 to cover the semiconductor pattern SM. The gate electrode GE may be disposed on the second insulating layer 20. The second insulating layer 20 may be disposed between the semiconductor pattern SM and the gate electrode GE of the transistor TR. The gate electrode GE may overlap the channel S1 of the semiconductor pattern SM on a plan view. The gate electrode GE may function as a mask in a process of doping the semiconductor pattern SM. The gate electrode GE may include molybdenum (Mo) having heat resistance, an alloy containing molybdenum, titanium (Ti), an alloy containing titanium, and the like, but the present disclosure is not limited thereto.

A structure of the transistor TR illustrated in FIG. 8A is illustrative, and the source S2 or the drain S3 of the transistor TR may be electrodes formed independently from the semiconductor pattern SM. In this case, the source S2 and the drain S3 may be in contact with the semiconductor pattern SM or connected to the semiconductor pattern SM through insulating layers. Further, the gate electrode GE may be disposed below the semiconductor pattern SM. The transistor TR according to an embodiment of the present disclosure may have various structures, and is not limited to any one embodiment.

The second insulating layer 20 and the third to sixth insulating layers 30 to 60, which will be described below, may include at least one of an inorganic layer and an organic layer. For example, the inorganic layer may include at least one of aluminum oxide, titanium oxide, silicon oxide, silicon oxynitride, zirconium oxide, and hafnium oxide. The organic layer may include at least one of acrylic resin, methacrylic resin, polyisoprene, vinyl resin, epoxy resin, urethane resin, cellulose resin, siloxane resin, polyamide resin, and perylene resin.

The third insulating layer 30 may be disposed on the second insulating layer 20 to cover the gate electrode GE. The upper electrode UE may be disposed on the third insulating layer 30. The upper electrode UE may overlap the gate electrode GE on a plan view, and the gate electrode GE and the upper electrode UE overlapping each other may form a capacitor.

The fourth insulating layer 40 may be disposed on the third insulating layer 30 to cover the upper electrode UE. The connection electrodes CN1 and CN2 may include a first connection electrode CN1 and a second connection electrode CN2. The first connection electrode CN1 may be disposed on the fourth insulating layer 40. The fifth insulating layer 50 may be disposed on the fourth insulating layer 40 to cover the first connection electrode CN1. The second connection electrode CN2 may be disposed on the fifth insulating layer 50. The sixth insulating layer 60 may be disposed on the fifth insulating layer 50 to cover the second connection electrode CN2. In an embodiment, at least one of the fifth insulating layer 50 and the sixth insulating layer 60 may include an inorganic layer, cover a step between components arranged therebelow, and provide a flat upper surface.

The first connection electrode CN1 may be electrically connected to the semiconductor pattern SM through a contact hole passing through the second to fourth insulating layers 20 to 40. The second connection electrode CN2 may be electrically connected to the first connection electrode CN1 through a contact hole passing through the fifth insulating later 50.

Each of the first connection electrode CN1 and the second connection electrode CN2 may include a conductive material. For example, each of the first connection electrode CN1 and the second connection electrode CN2 may include gold, silver, copper, aluminum, platinum, molybdenum, titanium, alloys thereof, or the like. At least one of the first connection electrode CN1 and the second connection electrode CN2 may include multi-layered conductive layers. For example, at least one of the first connection electrode CN1 and the second connection electrode CN2 may have a three-layered structure of titanium/aluminum/titanium. However, an embodiment is not limited thereto.

According to an embodiment of the circuit layer DP-CL, at least one of the first connection electrode CN1 and the second connection electrode CN2 may be omitted. Alternately, according to an embodiment of the circuit layer DP-CL, an additional connection electrode that connects the transistor TR and the light emission element OL may be further disposed. An electrical connection method between the light emission element OL and the transistor TR may be variously changed depending on the number of insulating layers arranged between the light emission element OL and the transistor TR, and is not limited to any one embodiment.

The display element layer DP-OL may include the light emission element OL and a pixel defining film PDL. The light emission element OL and the pixel defining film PDL may be arranged on the sixth insulating layer 60. The light emission element OL may include a first electrode AE, a light emission layer EM, and a second electrode CE.

The first electrode AE may be electrically connected to the second connection electrode CN2 through a contact hole passing through the sixth insulating layer 60. The first electrode AE may be electrically connected to the transistor TR through the first and second connection electrodes CN1 and CN2.

A pixel opening PX-OP at least partially exposing the first electrode AE may be defined by the pixel defining film PDL. An area of the first electrode AE exposed from the pixel defining film PDL may correspond to a light emission area. The pixel defining film PDL may include an inorganic layer, an organic layer, and a composite material layer. According to an embodiment, the pixel defining film PDL may further include a black pigment or a black dye.

The light emission layer EM may be disposed on the first electrode AE. The light emission layer EM may provide light having a predetermined color. The light emission layer EM may be disposed to correspond to the pixel opening PX-OP. The light emission element OL and the pixel opening PX-OP may be provided in plurality, and the light emission layers EM of the light emission elements OL are arranged to correspond to the pixel openings PX-OP, respectively, and provided in the form of patterns spaced apart from each other. However, the present disclosure is not limited thereto, and the light emission layers EM of the light emission elements OL may be formed as an integral common layer.

The second electrode CE may be disposed on the light emission layer EM and the pixel defining film PDL. The second electrode CE may be provided as a common electrode commonly disposed in the pixels PX (see FIG. 4).

The light emission element OL may further include at least one of a hole control area disposed between the first electrode AE and the light emission layer EM and an electron control area disposed between the light emission layer EM and the second electrode CE. The hole control area may include at least one of a hole generation layer, a hole transport layer, and an electron blocking layer, and the electron control area may include at least one of an electron generation layer, an electron transport layer, and a hole blocking layer.

The encapsulation layer ECL may be disposed on the display element layer DP-OL. The encapsulation layer ECL may be disposed on the light emitting element OP and the pixel defining film PDL to seal the light emitting element OL. The encapsulation layer ECL may include at least one of an inorganic film and an organic film. In an embodiment, the encapsulation layer ECL may include a first inorganic film EN1, a second inorganic film EN3, and an organic film EN2 disposed between the first and second inorganic films EN1 and EN3. However, a configuration of the encapsulation layer ECL is not limited thereto as long as the encapsulation layer ECL may seal the light emission element OL.

The first inorganic film EN1 may be disposed on the second electrode CE, and the organic film EN2 and the second inorganic film EN3 may be sequentially arranged on the first inorganic film EN1 in a thickness direction of the display panel DP. The first and second inorganic films EN1 and EN3 may protect the light emission element OL from moisture or oxygen introduced from the outside. For example, each of the first and second inorganic films EN1 and EN3 may include at least one of silicon nitride, silicon oxynitride, silicon oxide, titanium oxide, and aluminum oxide. However, the materials of the first and second inorganic films EN1 and EN3 are not limited to the above example. The organic film EN2 may prevent foreign substances from being introduced into the light emission element OL and cover steps of components arranged below the organic film EN2. For example, the organic film EN2 may include an acryl-based organic material. However, the material of the organic film EN2 is not limited to the above example.

The input detection unit ISP may be disposed on the display panel DP. The input detection unit ISP may include the base layer IL1, the first detection insulating layer IL2, the first detection conductive layer CL1, and the second detection conductive layer CL2. As illustrated in FIG. 3, the input detection unit ISP may further include the second detection insulating layer IL3 (see FIG. 3). The above description may be applied to the components of the input detection unit ISP.

The base layer IL1 may be in contact with the uppermost layer of the encapsulation layer ECL. For example, the base layer IL1 may be in contact with the second organic film EN3 of the encapsulation layer ECL. The base layer IL1 of the input detection unit ISP may be directly formed on the base surface provided by the encapsulation layer ECL. In other words, the base layer IL1 may be in direct contact with the second organic film EN3. However, the present disclosure is not limited thereto, and according to an embodiment, the base layer IL1 may be omitted. In this case, the first detection conductive layer CL1 of the input detection unit ISP may be in contact with the encapsulation layer ECL.

The first detection conductive layer CL1 may be disposed on the base layer IL1, and the second detection conductive layer CL2 may be disposed on the first detection insulating layer IL2. The first detection conductive layer CL1 and the second detection conductive layer CL2 may contact each other. The first detection conductive layer CL1 and the second detection conductive layer CL2 may constitute a detection electrode TE. The detection electrode TE may correspond to any one of the first and second detection electrodes TEX and TEY (see FIG. 5). For example, the first detection conductive layer CL1 may include a connection pattern BP of the detection electrode TE, and the second detection conductive layer CL2 may include a detection pattern SP of the detection electrode TE. However, the present disclosure is not limited thereto, the first detection conductive layer CL1 may include the detection pattern SP, and the second detection conductive layer CL2 may include the connection pattern BP.

The connection pattern BP may correspond to the first connection pattern BP1 (see FIG. 5) or the second connection pattern BP2 (see FIG. 5), and the detection pattern SP may correspond to a first detection pattern SP1 (see FIG. 5) or a second detection pattern SP2 (see FIG. 5). The connection pattern BP may be disposed on a different layer from the detection pattern SP and by connected with the detection pattern SP through a contact hole passing through the first detection insulating layer IL2. However, the present disclosure is not limited thereto, and the connection pattern BP and the detection pattern SP may be arranged on the same layer and integrally formed.

The detection electrode TE may be a mesh-shaped pattern and may be disposed to correspond to an area in which the pixel defining film PDL is disposed. However, the present disclosure is not limited thereto, and the detection electrode TE may be provided as a single pattern overlapping the light emission element OL. In this case, the detection electrode TE may include a transparent conductive material.

The first insulating layer 10 and the second insulating layer 20 may extend from the first base area AA1 on the base substrate BS and may be disposed on the second base area AA2. The first signal pad PD1 and the second signal pad PD2 may be arranged on the second insulating layer 20. The first signal pad PD1 may be disposed in the first sub-pad area PA1-1, and the second signal pad PD2 may be disposed in the second sub-pad area PA1-2. The first signal pad PD1 may be disposed closer to the display area DA inside the first base area AA1 than the second signal pad PD2.

Each of the first and second signal pads PD1 and PD2 may include a plurality of conductive patterns CP1, CP2, CP3, and CP4 arranged in a thickness direction. The first conductive patterns CP1 of the first signal pad PD1 and the second signal pad PD2 may be arranged on the second insulating layer 20. For example, the first conductive patterns CP1 of the first signal pad PD1 and the second signal pad PD2 may be in direct contact with the second insulating layer 20.

The first conductive patterns CP1 of the first signal pad PD1 and the second signal pad PD2 may be formed through the same process as that of the gate electrode GE of the transistor TR. For example, after a conductive layer is formed on the second insulating layer 20 through a deposition process such as sputtering or chemical vapor deposition, the conductive layer may be patterned to form the first conductive patterns CP1 of the first and second signal pads PD1 and PD2 and the gate electrode GE. The first conductive patterns CP1 of the first and second signal pads PD1 and PD2 may be arranged on the same layer as the gate electrode GE of the transistor TR and include the same material.

The third insulating layer 30 and the fourth insulating layer 40 may extend from the first base area AA1 and may be disposed on the second base area AA2. Through-holes exposing upper surfaces of the first conductive patterns CP1 of the first signal pad PD1 and the second signal pad PD2 may be formed in the third insulating layer 30 and the fourth insulating layer 40. The third insulating layer 30 and the fourth insulating layer 40 may be formed by sequentially depositing insulting layers on the first base area AA1 and the second base area AA2. Etching is then performed on the third and fourth insulating layers 30 and 40 so that portions of the upper surfaces of the first conductive patterns CP1 of the first and second signal pads PD1 and PD2 are exposed.

As illustrated in FIG. 8A, at least some of the insulating layers arranged inside the first base area AA1 may be arranged on the second base area AA2, and a stacking structure of the insulating layers arranged in the second base area AA2 is not particularly limited to the illustration.

The second conductive patterns CP2 of the first signal pad PD1 and the second signal pad PD2 may be arranged on the exposed upper surfaces of the first conductive patterns CP1. The second conductive patterns CP2 may be in contact with the first conductive patterns CP1, respectively. For example, the second conductive patterns CP2 may directly contact the first conductive patterns CP1, respectively. Portions of the second conductive patterns CP2 may be arranged on the fourth insulating layer 40. For example, the portions of the second conductive patterns CP2 may be arranged on the fourth insulating layer 40 while covering inner surfaces of the third and fourth insulating layers 30 and 40, which are exposed by through-holes. In other words, portions of the second conductive patterns CP2 may cover sidewalls of the third and fourth insulating layers 30 and 40.

The second conductive patterns CP2 of the first signal pad PD1 and the second signal pad PD2 may be formed through the same process as that of any one of conductive electrodes in the circuit layer DP-CL. For example, the second conductive patterns CP2 of the first signal pad PD1 and the second signal pad PD2 may be formed through the same process as that of the first connection electrode CN1. After a conductive layer is formed on the fourth insulating layer 40 through the deposition process such as the sputtering or the chemical vapor deposition, the conductive layer may be patterned to form the second conductive patterns CP2 of the first and second signal pads PD1 and PD2 and the first connection electrode CN1. The second conductive patterns CP2 of the first and second signal pads PD1 and PD2 may be arranged on the same layer as the first connection electrode CN1 and include the same material.

The third conductive patterns CP3 of the first signal pad PD1 and the second signal pad PD2 may be arranged on the second conductive patterns CP2, respectively. The third conductive patterns CP3 may be in contact with the second conductive patterns CP2, respectively. The third conductive patterns CP3 of the first signal pad PD1 and the second signal pad PD2 may be formed through the same process as that of any one of the conductive electrodes in the circuit layer DP-CL. For example, the third conductive patterns CP3 of the first signal pad PD1 and the second signal pad PD2 may be formed through the same process as that of the second connection electrode CN2. The fifth insulating layer 50 disposed below the second connection electrode CN2 may be open to correspond to an area in which the first and second signal pads PD1 and PD2 are arranged. In other words, the fifth insulating layer 50 may not be disposed on the second conductive patterns CP2 of the first and second signal pads PD1 and PD2, and a portion of a conductive layer deposited on the fifth insulating layer 50 may be in contact with the second conductive patterns CP2. After a conductive layer is formed on the fifth insulating layer 50 through the deposition process such as the sputtering or the chemical vapor deposition, the conductive layer may be patterned to form the third conductive patterns CP3 of the first and second signal pads PD1 and PD2 and the second connection electrode CN2. The third conductive patterns CP3 may be formed through the same process as that of the second connection electrode CN2 and include the same material.

Referring to FIG. 8B, the third conductive pattern CP3 may include a plurality of conductive layers M1, M2, and M3 arranged in the thickness direction of the display panel DP. FIG. 8B illustrates a structure of the third conductive pattern CP3 of the first signal pad PD1, but a description related thereto may be applied to the third conductive pattern CP3 of the second signal pad PD2. In an embodiment, the third conductive pattern CP3 may have the same stacked structure as that of the second connection electrode CN2.

The plurality of conductive layers M1, M2, and M3 may include the first, second and third conductive layers M1, M2, and M3. The first conductive layer M1 may include a material that is different from that of the second conductive layer M2. The first conductive layer M1 may include the same material as that of the third conductive layer M3. However, an embodiment is not necessarily limited thereto.

The first conductive layer M1 and the third conductive layer M3 may include a metal material having corrosion resistance. The first conductive layer M1 and the third conductive layer M3 may be arranged on a lower surface and an upper surface of the second conductive layer M2 and protect the second conductive layer M2 from scratches generated during a process. Further, the first conductive layer M1 and the third conductive layer M3 may prevent corrosion of the second conductive layer M2 due to moisture permeation. For example, the first conductive layer M1 and the third conductive layer M3 may include at least one of molybdenum, titanium, and an alloy thereof. However, the materials of the first conductive layer M1 and the third conductive layer M3 are not limited to the above example.

The second conductive layer M2 may be disposed between the first conductive layer M1 and the third conductive layer M3. The second conductive layer M2 may include a metal material having low resistance. For example, the second conductive layer M2 may include at least one of gold, silver, copper, aluminum, platinum, and alloys thereof. However, the material of the second conductive layer M2 is not limited to the above example.

The second conductive layer M2 may have a thickness that is greater than thicknesses of the first conductive layer M1 and the third conductive layer M3. Since the second conductive layer M2 including a material having relatively low resistance has a large thickness, the first signal pad PD1 may have low resistance.

Referring back to FIGS. 8A and 8B, the display panel DP may include insulating patterns IP arranged on the second base area AA2. The insulating patterns IP may be arranged to correspond to the first and second signal pads PD1 and PD2 and may cover edges of the first and second signal pads PD1 and PD2. For example, edges EE of the third conductive patterns CP3 of the first signal pad PD1 and the second signal pad PD2 may be arranged on the fourth insulating layer 40, and the insulating patterns IP may be arranged on the fourth insulating layer 40 and cover the edges EE of the third conductive patterns CP3. Portions of the insulating patterns IP may be overlapped by the fourth conductive patterns CP4.

The insulating patterns IP may be simultaneously formed through the same process as that of at least one of the insulating layers included in the circuit layer DP-CL. For example, the insulating patterns IP may be formed simultaneously in a process of forming the sixth insulating layer 60. After insulating layers are formed on the fifth insulating layer 50 and the third conductive patterns CP3 of the first and second signal pads PD1 and PD2 through a process such as deposition, coating, or printing, the insulating layers may be patterned to form the sixth insulating layer 60 and the insulating patterns IP. The insulating patterns IP may include the same material as a material included in the sixth insulating layer 60. The insulating patterns IP may be formed by etching or patterning the insulating layers to cover the edges EE of the third conductive patterns CP3 of the first and second signal pads PD1 and PD2.

The insulating patterns IP may include organic materials. For example, the insulating patterns IP may include at least one of acrylic resin, methacrylic resin, polyisoprene, vinyl resin, epoxy resin, urethane resin, cellulose resin, siloxane resin, polyamide resin, and perylene resin. However, the materials of the insulating patterns IP are not limited to the above example.

When the insulating patterns IP are not arranged, the edges EE of the third conductive patterns CP3 may be exposed in an etching process of forming the first electrode AE of the light emission element OL. Accordingly, the edges EE of the third conductive patterns CP3 may be exposed to an etchant for forming the first electrode AE, and some of the edges EE may be etched by the etchant or damaged.

According to an embodiment, as illustrated in FIG. 8B, the third conductive pattern CP3 may include the first to third conductive layers M1, M2, and M3 including different materials, and when the insulating patterns IP are not arranged, edges of the first to third conductive layers M1, M2, and M3 may be exposed to the etchant and thus etched in the etching process of forming the first electrode AE. In this case, the edges of the first and third conductive layers M1 and M3 may protrude further than the edge of the conductive layer M2 to form a tip due to a difference between etching speeds of the first to third conductive layers M1, M2, and M3. When the tip is formed in the third conductive pattern CP3, a stacking defect may occur in a component disposed on the third conductive pattern CP3.

Further, when the insulating patterns IP are not arranged, metal ions formed in a process of etching the first electrode AE react with the third conductive pattern CP3, and thus impurities may be formed in the edge EE of the third conductive pattern CP3. In other words, when the insulating patterns IP are not arranged, the tip or the impurities may be formed in the edge EE of the third conductive pattern CP3, a short defect may occur in the first and second signal pads PD1 and PD2, and thus driving reliability of the display panel DP may be degraded.

However, the insulating patterns IP may cover the edges EE of the third conductive patterns CP3 of the first and second signal pads PD1 and PD2, thereby preventing the impurities or the tip from being formed on the third conductive patterns CP3. By virtue of the insulating patterns IP, the first and second signal pads PD1 and PD2 may be protected, the short defect occurring in the first and second signal pads PD1 and PD2 may be prevented, and reliability of the display panel DP may be improved.

The base layer IL1 of the input detection unit ISP may extend from the first base area AA1 and may be disposed on the second base area AA2. The base layer IL1 disposed on the second base area AA2 may be referred to as an insulating film IF. In other words, the base layer IL1 disposed on the first base area AA1 and the insulating film IF disposed on the second base area AA2 may be an integral insulating film. However, an embodiment is not limited thereto, and both the base layer IL1 and the first detection insulating layer IL2 of the input detection unit ISP may extend from the first base area AA1 and may be arranged on the second base area AA2.

In this case, the base layer IL1 and the first detection insulating layer IL2 stacked on the second base area AA2 may correspond to the insulating film IF.

The insulating film IF may be disposed on the first sub-pad area PA1-1 and the second sub-pad area PA1-2. The insulating film IF may be formed simultaneously with a process of forming the insulating layer (for example, the base layer IL1 or the first detection insulating layer IL2) included in the input detection unit ISP. For example, after the insulating layer is deposited on the first and second base areas AA1 and AA2 through the deposition process such as chemical vapor deposition, the insulating layer may be etched or patterned to form the base layer IL1 (or the first detection insulating layer IL2) and the insulating film IF.

The insulating film IF may include an inorganic material, and may prevent inflow of moisture or oxygen. For example, the insulating film IF may include at least one of aluminum oxide, titanium oxide, silicon oxide, silicon oxynitride, zirconium oxide, and hafnium oxide. However, the material of the insulating film IF is not limited to the above example.

A plurality of openings OP1 and OP2 may be formed in the insulating film IF. The first opening OP1 of the insulating film IF may be formed to correspond to the first sub-pad area PA1-1, and the second opening OP2 of the insulating film IF may be formed to correspond to the second sub-pad area PA1-2. The first opening OP1 may overlap the first signal pad PD1, and the second opening OP2 may overlap the second signal pad PD2.

The first opening OP1 may overlap the first signal pad PD1 and expose an insulating pattern IP disposed adjacent to an edge of the first signal pad PD1. For example, the insulating pattern IP that covers the edge of the third conductive pattern CP3 of the first signal pad PD1 may be exposed from the insulating film IF through the first opening OP1. Since the first opening OP1 exposing the first signal pads PD1 is formed in the insulating film IF, in a process of bonding the data driver DDV (see FIG. 6) onto the first signal pads PD1 arranged in the plurality of input pad rows P-1 to P-5 (see FIG. 6), rising of the insulating film IF disposed between the first signal pads PD1 may be prevented. This will be described below in detail.

The second opening OP2 may overlap a portion of the second signal pad PD2. A planar area of the second opening OP2 may be smaller than a planar area of at least one of the first to fourth conductive patterns CP1, CP2, CP3, and CP4 of the second signal pad PD2. For example, in a plan view, the planar area of the second opening OP2 may be smaller than the planar area of the third conductive pattern CP3 of the second signal pad PD2. Accordingly, the insulating film IF disposed on the second sub-pad area PA1-2 may overlap an edge of the third conductive pattern CP3 of the second signal pad PD2. Further the insulating film IF disposed on the second sub-pad area PA1-2 may cover the insulating pattern IP adjacent to the second signal pad PD2. For example, the insulating pattern IP that covers the edge of the third conductive pattern CP3 of the second signal pad PD2 may be covered by the insulating film IF.

As described above, the second signal pads PD2 may be arranged in the one output pad row P-10 (see FIG. 7), and lifting of the insulating film IF adjacent to the second signal pads PD2 arranged in the one output pad row in a process of bonding the data driver DDV (see FIG. 6) may be prevented. Thus, the insulating film IF disposed on the second sub-pad area PA1-2 may be disposed to cover a portion of the second signal pad PD2, corresponding to the edge thereof, and the insulating pattern IP, and therefore, moisture or oxygen may be prevented from being introduced into the insulating pattern IP.

The fourth conductive patterns CP4 of the first signal pad PD1 and the second signal pad PD2 may be arranged on upper surfaces of the third conductive patterns CP3, which are exposed by the insulating film IF. The fourth conductive patterns CP4 may be in contact with the third conductive patterns CP3. The fourth conductive pattern CP4 of the first signal pad PD1 may overlap the first opening OP1 and may be spaced apart from the insulating film IF. A portion of the fourth conductive pattern CP4 of the second signal pad PD2 may be disposed on the insulating film IF. In this case, a portion of the fourth conductive pattern CP4 of the second signal pad PD2 may overlap an edge of the insulating film IF near the second opening OP2. For example, the fourth conductive pattern CP4 of the second signal pad PD2 may be disposed on the insulating film IF overlapping the third conductive pattern CP3 of the second signal pad PD2. However, an embodiment is not necessarily limited thereto.

The fourth conductive patterns CP4 of the first signal pad PD1 and the second signal pad PD2 may be formed through the same process as that of any one of the conductive layers of the input detection unit ISP. For example, the fourth conductive patterns CP4 of the first signal pad PD1 and the second signal pad PD2 may be formed through the same process as that of the first detection conductive layer CL1 or the second detection conductive layer CL2. As an example, after the base layer IL1 and the insulating film IF are formed, the conductive layer is formed thereon through the deposition process such as sputtering or chemical vapor deposition. Thereafter, the conductive layer may be patterned to form the first detection conductive layer CL1 and the fourth conductive patterns CP4 of the first and second signal pads PD1 and PD2. The fourth conductive patterns CP4 may include the same material as that of the first detection conductive layer CL1 or the second detection conductive layer CL2.

Figure 9A:
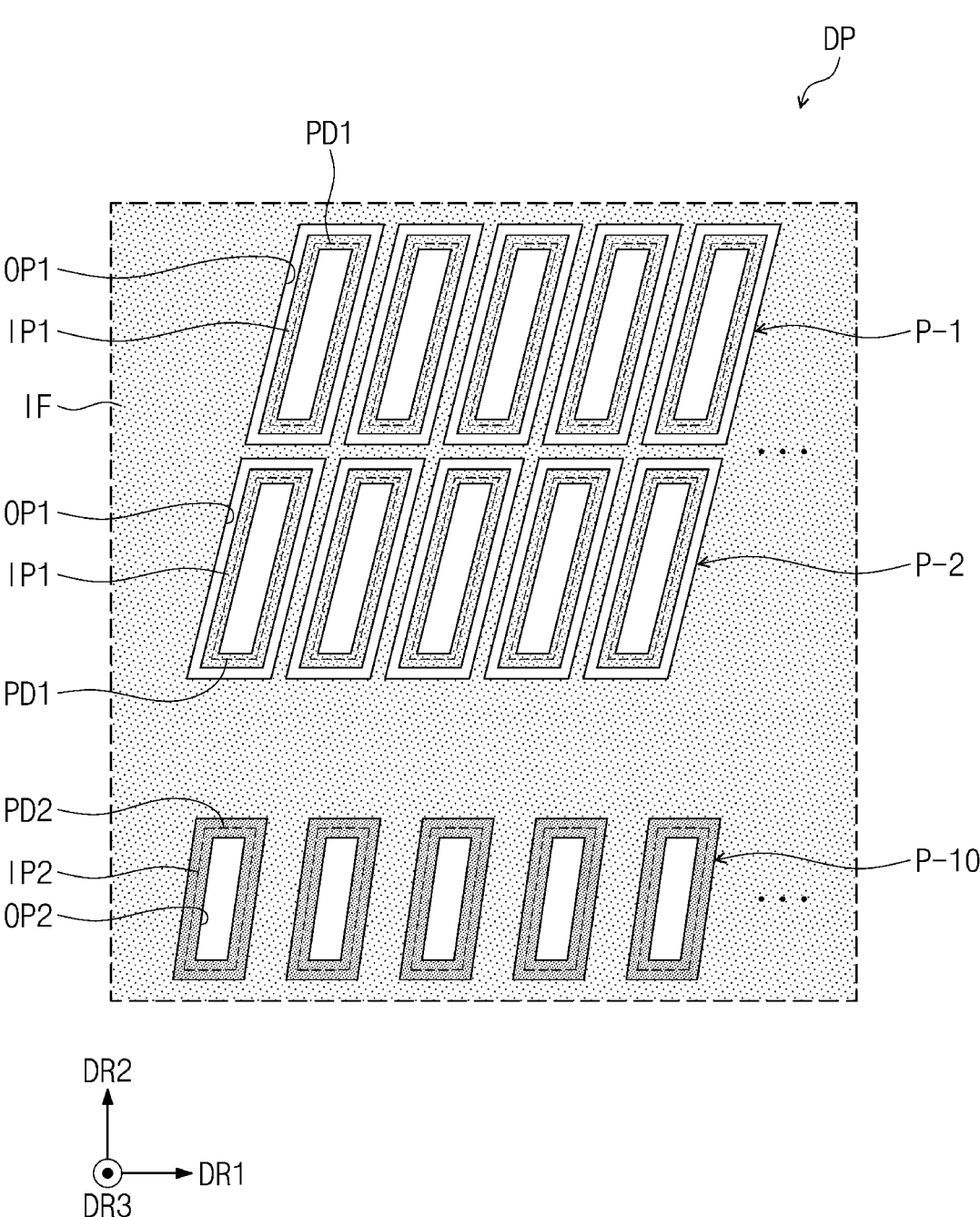
FIG. 9A is an enlarged plan view of the display panel according to an embodiment of the present disclosure.
Figure 9B:
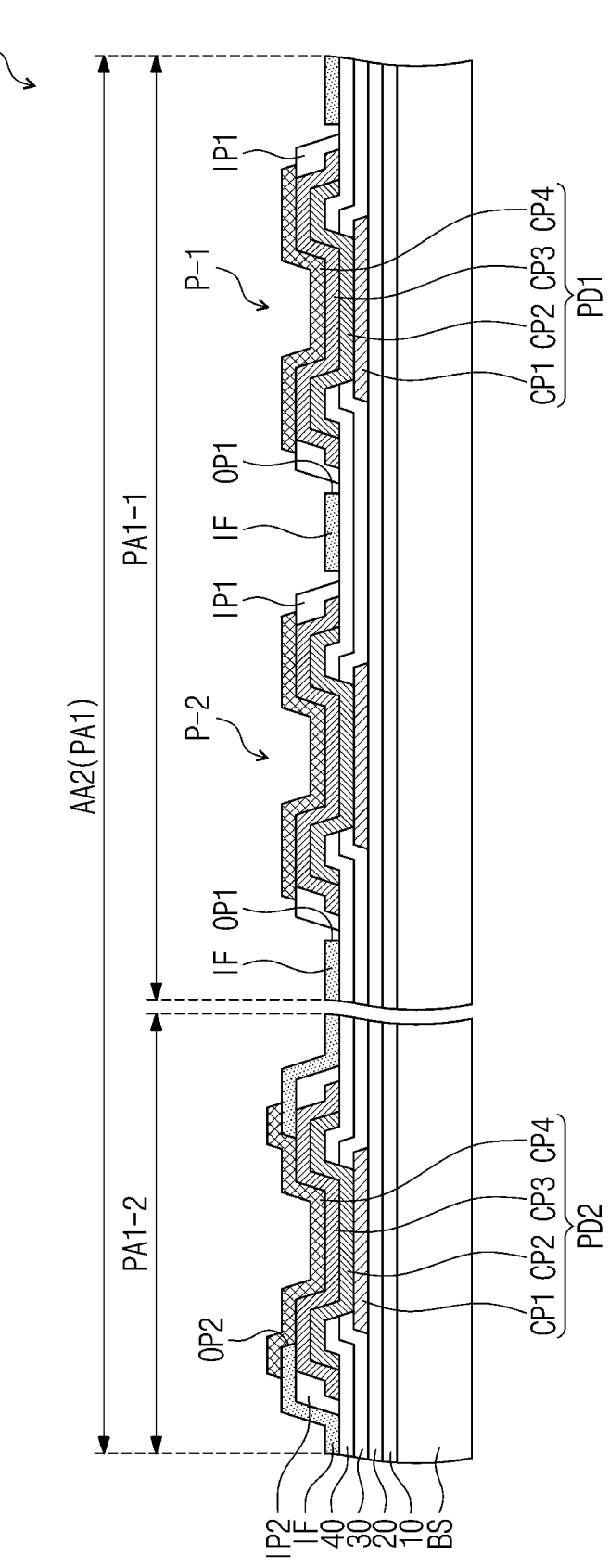
FIG. 9B is a cross-sectional view of the display panel according to an embodiment of the present disclosure.

FIG. 9A is an enlarged plan view of the display panel DP according to an embodiment of the present disclosure. FIG. 9B is a cross-sectional view of the display panel DP according to an embodiment of the present disclosure. FIGS. 9A and 9B are a plan view and a cross-sectional view of a portion of the display panel DP, which corresponds to the second base area AA2.

FIGS. 9A and 9B illustrate the first signal pads PD1 arranged in the first and second input pad rows P-1 to P-2 and the second signal pads PD2 arranged in the first output pad row P-10. The above description may be applied to components illustrated in FIGS. 9A and 9B.

Referring to FIGS. 9A and 9B, the first signal pads PD1 of the first input pad row P-1 may be arranged in the first direction DR1. The first signal pads PD1 of the second input pad row P-2 may be arranged in the first direction DR1. The first input pad row P-1 and the second input pad row P-2 may be arranged in the second direction DR2. The first signal pads PD1 according to an embodiment of the present disclosure may be arranged in at least two input pad rows arranged in the second direction DR2.

The second signal pads PD2 of the first output pad row P-10 may be arranged in the first direction DR1. The second signal pads PD2 according to an embodiment of the present disclosure may be arranged in the one output pad row.

The display panel DP may include a plurality of insulating patterns IP1 and IP2. The description of the insulating pattern IP of FIG. 8A may be equally applied to the insulating patterns IP1 and IP2. The insulating patterns IP1 and IP2 may include the first insulating patterns IP1 and the second insulating patterns IP2.

The first insulating patterns IP1 may overlap the edges of the first signal pads PD1, respectively. For example, the first insulating patterns IP1 may cover the edge of any one conductive pattern (for example, the third conductive pattern CP3 of FIG. 9B) among the conductive patterns constituting the first signal pads PD1. In particular, the first insulating patterns IP1 may cover four edges of each of the first signal pads PDL. The first insulating patterns IP1 may cover the edges of the first signal pads PD1 to protect the edges of the first signal pads PD1 and to prevent a short defect in the first signal pads PD1.

With respect to the one first insulating pattern IP1, the first insulating pattern IP1 may overlap a portion of the first signal pad PD1 and expose a portion of an upper surface of the first signal pad PD1. The first signal pad PD1 may be electrically connected to the output bump of the data driver DDV (see FIG. 6) through the upper surface exposed from the first insulating pattern IP1.

The second insulating patterns IP2 may overlap the edges of the second signal pads PD2, respectively. For example, the second insulating patterns IP2 may cover the edge of any one conductive pattern (for example, the third conductive pattern CP3 of FIG. 9B) among the conductive patterns constituting the second signal pads PD2. In particular, the second insulating patterns IP2 may cover four edges of each of the second signal pads PD2. The second insulating patterns IP2 may cover the edges of the second signal pads PD2 to protect the edges of the second signal pads PD2 and to prevent a short defect in the second signal pads PD2.

With respect to the one second insulating pattern IP2, the second insulating pattern IP2 may overlap a portion of the second signal pad PD2 and expose a portion of an upper surface of the second signal pad PD2. The second signal pad PD2 may be electrically connected to the input bump of the data driver DDV (see FIG. 6) through the upper surface exposed from the second insulating pattern IP2.

The insulating film IF may be disposed on the second base area AA2. The insulating film IF may include a plurality of first openings OP1 and a plurality of second openings OP2.

The first openings OP1 may be formed in the first sub-pad area PA1-1 and overlap the first signal pads PD1, respectively. In other words, the first signal pads PD1 may not overlap the insulating film IF. The first signal pads PD1 and the first insulating patterns IP1 arranged on the first signal pads PD1 may be exposed by the first openings OP1 in the insulating film IF.

When the insulating film IF overlaps some of the first signal pads PD1 and the first insulating patterns PI, in a process of bonding the data driver DDV (see FIG. 6) onto the first signal pads PD1, the insulating film IF may be broken in an area between the first signal pads PD1 in the first direction DR1 or in an area between the first and second input pad rows P-1 and P-2 in the second direction DR2. Accordingly, since moisture or oxygen may flow into the first insulating patterns IP1, the first insulating patterns IP1 may be expanded, the insulating film IF may be oxidized, and thus the insulating film IF may be lifted in the first sub-pad area PA1-1. Accordingly, the conductive pattern disposed on the insulating film IF is also lifted, and thus a resistance of the first signal pads PD1 may increase.

However, in the insulating film IF according to an embodiment of the present disclosure, since the first openings OP1 corresponding to the first signal pads PD1 and the first insulating patterns IP1 are provided, the insulating film IF may not overlap the first signal pads PD1 and the first insulating patterns IP1, and the insulating film IF may be prevented from being lifted due to a damage to the insulating film IF in an area on the first signal pads PD1 and an area between the first signal pads PD1. In particular, the insulating film IF may be intensively lifted in an area in which short sides of the first signal pads PD1 face each other, in other words, an area between the input pad rows P-1 and P-2. However, according to the present disclosure, this defect of the insulating film IF may be prevented. Accordingly, the conductive pattern may be prevented from being lifted inside the first signal pads PD1, and thus the resistance of the first signal pads PD1 may be prevented from increasing. Accordingly, the driving reliability of the display panel DP may be improved.

The second openings OP2 may be formed in the second sub-pad area PA1-2 and overlap the second signal pads PD2, respectively. A planar area of each of the second openings OP2 may be smaller than a planar area of the second signal pad PD2. Accordingly, the insulating film IF may overlap portions of the second signal pads PD2, which correspond to the edges thereof.

The insulating film IF may cover the second insulating patterns IP2. Unlike an area in which the first signal pads PD1 are arranged, in an area adjacent to the second signal pads PD2 arranged in the one output pad row P-10, the insulating film IF is hardly lifted. Accordingly, the insulating film IF disposed on the second sub-pad area PA1-2 may cover the second insulating patterns IP2, and the insulating film IF may prevent moisture or oxygen from being introduced into the second insulating patterns IP2.

Figure 10A:
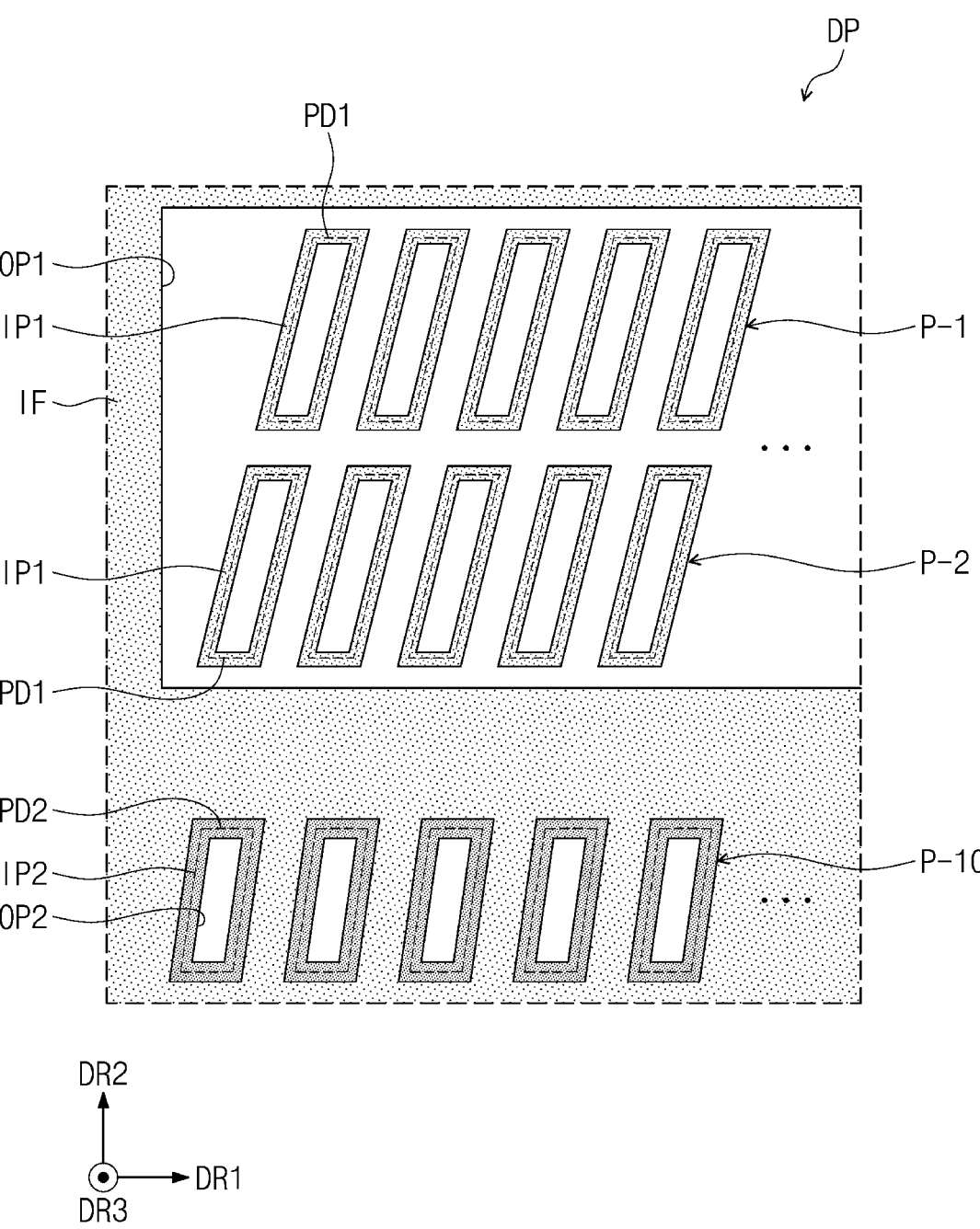
FIG. 10A is an enlarged plan view of the display panel according to an embodiment of the present disclosure.
Figure 10B:
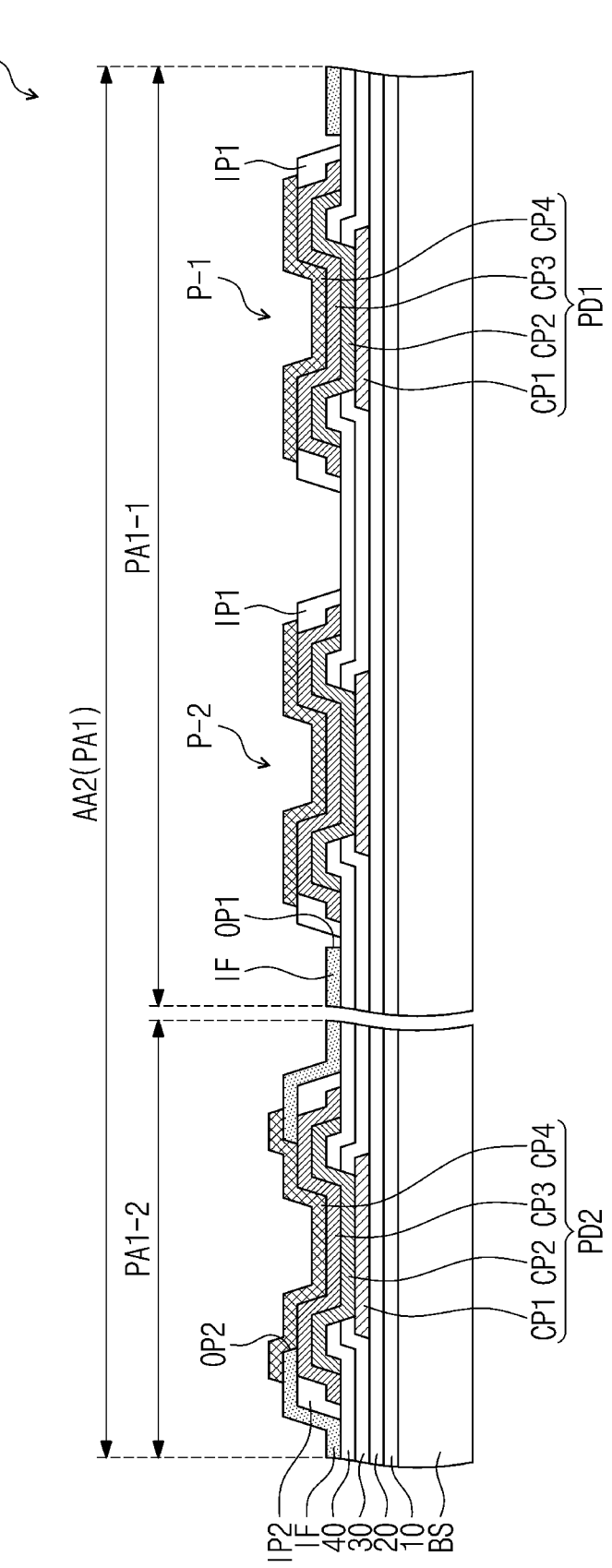
FIG. 10B is a cross-sectional view of the display panel according to an embodiment of the present disclosure.

FIG. 10A is an enlarged plan view of the display panel DP according to an embodiment of the present disclosure. FIG. 10B is a cross-sectional view of the display panel DP according to an embodiment of the present disclosure. FIGS. 10A and 10B are a plan view and a cross-sectional view of a portion of the display panel DP, which corresponds to the second base area AA2.

An embodiment of the display panel DP illustrated in FIGS. 10A and 10B includes the same configuration as an embodiment of the display panel DP illustrated in FIGS. 9A and 9B, but there is a difference in terms of the shape of the first opening OP1 of the insulating film IF. Hereinafter, the same description related to the configurations will be omitted, and a difference will be mainly described.

Referring to FIGS. 10A and 10B, the insulating film IF may include the one first opening OP1. The first opening OP1 may be formed in an area in which the first signal pads PD1 are arranged. In other words, the single first opening OP1 may overlap the first signal pads PD1 and the first insulating patterns IP1. For example, the first opening OP1 may overlap the first signal pads PD1 arranged in the first and second input pad rows P-1 and P-2. Therefore, in a process of bonding the data driver DDV (see FIG. 6) onto the first signal pads PD1, the insulating film IF may be prevented from being lifted in an area between the first signal pads PD1 arranged in the first direction DR1 and the second direction DR2. An embodiment of the first opening OP1 illustrated in FIGS. 9A and 10A is merely an example, and the number, the shape, and the area of the first openings OP1 are not limited thereto as long as the first openings OP1 overlap the first signal pads PD1 and the first insulating patterns IP1.

Figure 11:
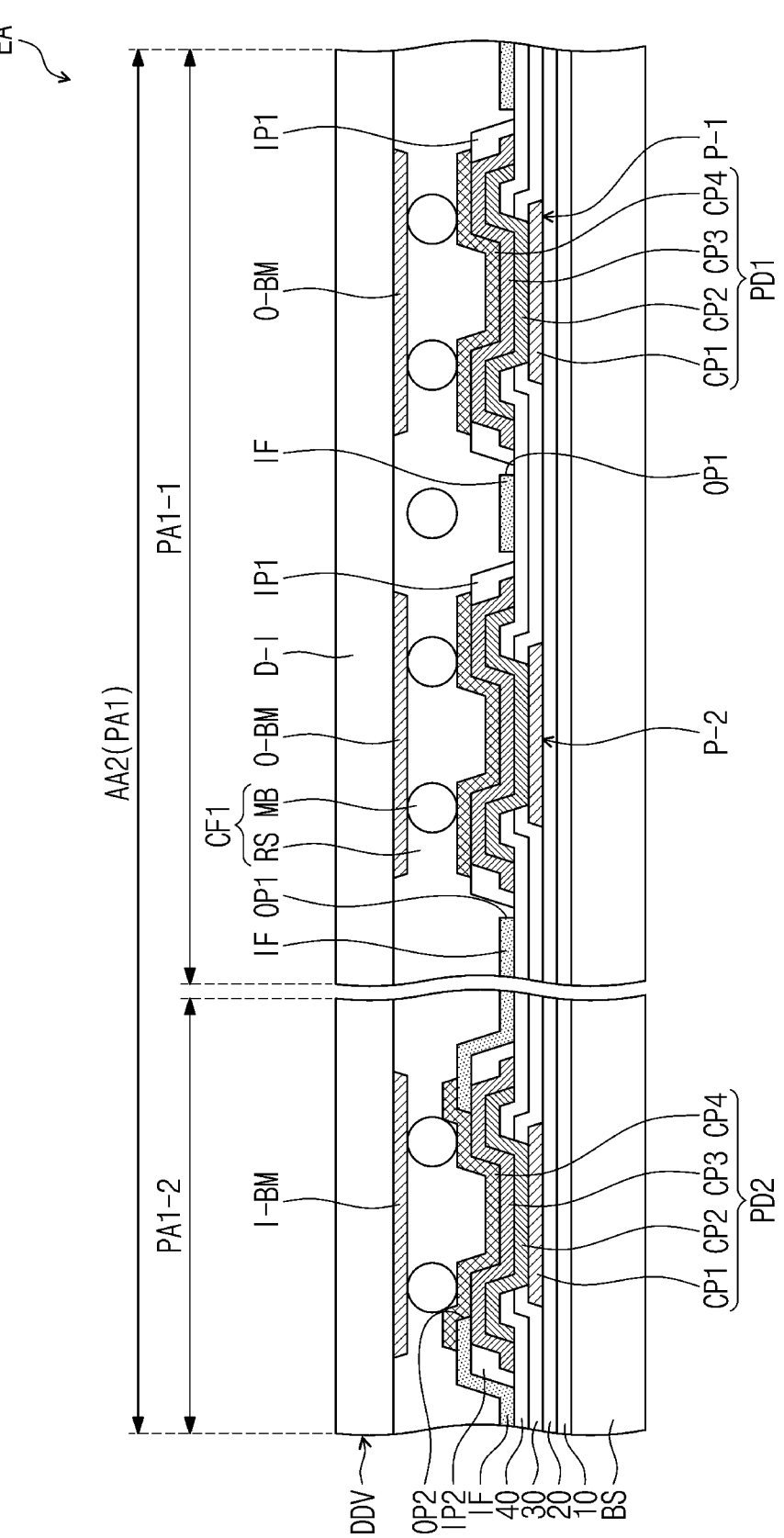
FIG. 11 is a cross-sectional view of the electronic device according to an embodiment of the present disclosure.

FIG. 11 is a cross-sectional view of the electronic device EA according to an embodiment of the present disclosure. FIG. 11 illustrates a cross section of the electronic device EA in which the data driver DDV is bonded onto the display panel illustrated in FIG. 9A. The above description may be equally applied to components of the display panel DP illustrated in FIG. 11, and the same description will be omitted below.

Referring to FIG. 11, the data driver DDV may include a driving integrated circuit D-I and signal bumps O-BM and I-BM connected to circuit signal pads of the driving integrated circuit D-I. In an embodiment, it is described that the circuit signal pads and the signal bumps O-BM and I-BM are distinguished, but the present disclosure is not limited thereto. For example, the circuit signal pads may correspond to signal terminals in an electronic component not including the signal bumps O-BM and I-BM.

The signal bumps O-BM and I-BM may include the output bumps O-BM and the input bumps I-BM. The output bumps O-BM may be electrically connected to the first signal pads PD1, respectively, and the input bumps I-BM may be electrically connected to the second signal pads PD2, respectively. Each of the output bumps O-BM may overlap the corresponding first signal pad PD1, and each of the input bumps I-BM may overlap the corresponding second signal pad PD2.

The data driver DDV may receive first signals passing through the second signal pads PD2 and the input bumps I-BM. The data driver DDV may provide second signals generated on the basis of the first signals to corresponding data lines through the output bumps O-BM and the first signal pads PD1. The first signals may be image signals that are digital signals applied from the outside, and the second signals may be data signals that are analog signals. The data driver DDV may generate an analog voltage corresponding to a gradation value of the image signal.

The first conductive adhesive layer CF1 may be disposed between the data driver DDV and the display panel DP to electrically connect the data driver DDV and the display panel DP. The data driver DDV may be bonded onto the first pad area PA1 in the second base area AA2 through the first conductive adhesive layer CF1. In other words, the data driver DDV may be bonded onto the first sub-pad area PA1-and the second sub-pad area PA1-2 through the first conductive adhesive layer CF1.

The first conductive adhesive layer CF1 may include an adhesive resin RS and conductive particles MB dispersed in the adhesive resin RS. In an embodiment, the first conductive adhesive layer CF1 may be an anisotropic conductive adhesive.

The adhesive resin RS may fill a gap between the conductive particles MB and couple the data driver DDV and the display panel DP. The adhesive resin RS may include a polymer material. For example, the adhesive resin RS may include an acrylic polymer, a silicone polymer, a urethane polymer, or an imide polymer. The adhesive resin RS may be formed by heat-curing or photo-curing a base resin such as an acrylic resin, a silicone resin, a urethane resin, or an imide resin.

The conductive particles MB may be metal particles or alloy particles in which a plurality of metals are mixed. For example, the conductive particles MB may be metal particles including silver, copper, bismuth, zinc, indium, tin, nickel, cobalt, chromium, or iron, and metal alloy particles thereof. Alternatively, the conductive particles MB may have a core portion formed of a polymer resin or the like and a coating layer surrounding the core portion and made of a conductive material.

The conductive particles MB may be aligned between the signal pads PD1 and PD2 and the signal bumps O-BM and I-BM corresponding to each other inside the adhesive resin RS. The conductive particles MB may have anisotropy so that a current flows in a pressing direction through pressing in a process of bonding the data driver DDV. Accordingly, the signal pads PD1 and PD2 may be electrically connected to the signal bumps O-BM and I-BM through the conductive particles MB, respectively.

In a process of bonding the data driver DDV by applying pressure to the data driver DDV, the insulating film IF may be pressed by the conductive particles MB arranged between the data driver DDV and the first pad area PA1 of the display panel DP. In this case, cracks may occur in a portion of the insulating film IF due to the conductive particles MB, and when the insulating film IF covers some conductive patterns of the first signal pads PD1 and the first insulating patterns IP1, the first insulating patterns IP1 may be expanded due to damage to the insulating film IF. Further, the first signal pads PD1 and the insulating film IF overlapping a portion between the first signal pads PD1 may be lifted, and accordingly, the conductive patterns CP1, CP2, CP3, and CP4 of the first signal pads PD1 may be also lifted.

However, the insulating film IF according to an embodiment of the present disclosure may not overlap the first signal pads PD1 and the first insulating patterns IP1 due to the first openings OP1, and thus the damage to the insulating film IF by the conductive particles MB may be minimized. Thus, the insulating film IF may be prevented from being lifted between the first signal pads PD1. Further, even when cracks occur in an area between the first signal pads PD1 in the insulating film IF due to the conductive particles MB, the cracks may not affect the first signal pads PD1 and the first insulating patterns IP1. Thus, the driving reliability of the display panel DP may be improved.

A display module according to an embodiment may include an insulating pattern that covers an edge of a conductive pattern constituting signal pads, thereby preventing a short defect from occurring at the edge of the conductive pattern.

An insulating film of the display module according to an embodiment includes openings overlapping the signal pads corresponding to output bumps of a data driver, and thus in a process of bonding the data driver, the insulating film between the signal pads arranged in a plurality of rows or a portion between the conductive patterns of the signal pads may be prevented from being lifted, so that an increase in a resistance of the signal pads may be prevented. Therefore, the driving reliability of the display module may be improved.

The insulating film of the display module according to an embodiment may be disposed on edges of the signal pads corresponding to input bumps of the data driver and cover the insulating pattern including an organic material, thereby preventing permeation of moisture into the insulating pattern or expansion of the insulating pattern.

What is claimed is:

1. A display module comprising:
a display panel including pixels arranged in a display area, first signal pads arranged in a non-display area and electrically connected to the pixels through signal lines, and second signal pads arranged in the non-display area and spaced farther from the display area than the first signal pads;
first insulating patterns arranged at edges of the first signal pads;
second insulating patterns arranged at edges of the second signal pads; and
an insulating film disposed on the non-display area, wherein the insulating film is spaced apart from the first signal pads and the first insulating patterns, overlaps the edges of the second signal pads, and covers the second insulating patterns.

2. The display module of claim 1, wherein the insulating film includes an inorganic material.

3. The display module of claim 1, wherein each of the first insulating patterns and the second insulating patterns includes an organic material.

4. The display module of claim 1, wherein the insulating film includes a first opening, and
the first signal pads and the first insulating patterns are disposed in the first opening.

5. The display module of claim 1, wherein the insulating film includes a plurality of first openings, and
the plurality of first openings respectively overlap the first signal pads.

6. The display module of claim 4, wherein the insulating film includes a plurality of second openings, and
the plurality of second openings overlap the second signal pads, respectively and do not overlap the second insulating patterns.

7. The display module of claim 1, wherein each of the pixels includes a transistor and a light emitting element electrically connected to the transistor.

8. The display module of claim 7, wherein the first insulating patterns and the second insulating patterns include the same material as that of any one of insulating layers arranged between the transistor and the light emitting element.

9. The display module of claim 7, wherein the first signal pads and the second signal pads include conductive patterns stacked in a thickness direction of the display panel.

10. The display module of claim 9, wherein the transistor includes a semiconductor pattern and a gate electrode disposed on the semiconductor pattern, and
at least one of the conductive patterns of the first signal pads and the second signal pads includes the same material as that of the gate electrode.

11. The display module of claim 9, wherein the display panel further includes a connection electrode connecting the transistor and the light emitting element, and
at least one of the conductive patterns of the first signal pads and the second signal pads includes the same material as that of the connection electrode.

12. The display module of claim 9, further comprising:
an input detection unit disposed on the display panel and including an insulating layer and a detection conductive layer,
wherein at least one of the conductive patterns of the first signal pads and the second signal pads includes the same material as that of the detection conductive layer.

13. The display module of claim 12, wherein the input detection unit includes:
a base layer in contact with the display panel;
a first detection conductive layer disposed on the base layer;
a detection insulating layer disposed on the first detection conductive layer; and
a second detection conductive layer disposed on the detection insulating layer, and
the insulating film includes the same material as that of the base layer or the detection insulating layer.

14. The display module of claim 9, wherein at least one of the conductive patterns of the first signal pads includes a first conductive layer, a second conductive layer, and a third conductive layer, and the second conductive layer includes a material different from that of the first conductive layer and the third conductive layer.

15. The display module of claim 14, wherein the first insulating patterns cover edges of the first conductive layer, the second conductive layer, and the third conductive layer of the first signal pads.

16. The display module of claim 1, wherein the first signal pads include a plurality of pad rows formed by the first signal pads arranged in a first direction among the first signal pads, and the plurality of pad rows are arranged in a second direction intersecting the first direction.

17. An electronic device comprising:

a display panel including pixels arranged in a display area and first and second signal pads arranged in a non-display area;

an input detection unit disposed on the display panel;

an electronic module disposed below the display area; and a data driver disposed on the non-display area and including input bumps electrically connected to the first signal pads and output bumps electrically connected to the second signal pads, wherein the input detection unit includes an insulating film extending from the display area to the non-display area, and the insulating film does not overlap the first signal pads and overlaps edges of the second signal pads.

18. The electronic device of claim 17, further comprising:

a conductive adhesive disposed between the data driver and the display panel, wherein the conductive adhesive includes an adhesive resin and conductive particles in the adhesive resin.

19. The electronic device of claim 17, further comprising:

first insulating patterns arranged at edges of the first signal pads; and second insulating patterns arranged at the edges of the second signal pads, wherein the insulating film is spaced apart from the first insulating patterns and covers the second insulating patterns.

20. The electronic device of claim 19, wherein each of the first signal pads and the second signal pads includes a first conductive layer, a second conductive layer, and a third conductive layer arranged in a thickness direction of the display panel, the second conductive layer includes a material different from those of the first conductive layer and the third conducive layer, the first insulating patterns cover edges of the first conductive layer, the second conductive layer, and the third conductive layer of the first signal pads, and the second insulating patterns cover edges of the first conductive layer, the second conductive layer, and the third conductive layer of the second signal pads.

* * * * *